US012687890B2

(12) United States Patent
Kim et al.

(10) Patent No.: US 12,687,890 B2
(45) Date of Patent: Jul. 21, 2026

(54) PARTIALLY CURVED OR FOLDABLE DISPLAY DEVICE INCLUDING RECESS GROOVES AND MANUFACTURING METHOD THEREFOR

(71) Applicant: TOVIS CO., LTD., Incheon (KR)

(72) Inventors: Yong Beom Kim, Incheon (KR); Ryong Min Park, Gyeonggi-do (KR); In Suk Lee, Incheon (KR); Won Gyu Lee, Incheon (KR); Eun Sung Kim, Incheon (KR)

(73) Assignee: TOVIS CO., LTD., Incheon (KR)

( * ) Notice: Subject to any disclaimer, the term of this patent is extended or adjusted under 35 U.S.C. 154(b) by 891 days.

(21) Appl. No.: 17/796,893

(22) PCT Filed: Jan. 20, 2021

(86) PCT No.: PCT/KR2021/095023
§ 371 (c)(1),
(2) Date: Aug. 2, 2022

(87) PCT Pub. No.: WO2021/158094
PCT Pub. Date: Aug. 12, 2021

(65) Prior Publication Data
US 2023/0054670 A1      Feb. 23, 2023

(30) Foreign Application Priority Data

Feb. 6, 2020    (KR) ........................ 10-2020-0014175

(51) Int. Cl.
*G06F 1/16*        (2006.01)
*G02F 1/1362*      (2006.01)
(Continued)

(52) U.S. Cl.
CPC ...... *G06F 1/1652* (2013.01); *G02F 1/136222* (2021.01); *G02F 1/1368* (2013.01);
(Continued)

(58) Field of Classification Search
CPC .............................. G06F 1/1652; G06F 1/1641
See application file for complete search history.

(56) References Cited

U.S. PATENT DOCUMENTS 10,705,360 B2    7/2020  Lee et al.
11,029,724 B2    6/2021  Hong et al.
(Continued)

FOREIGN PATENT DOCUMENTS

JP        7-1424        1/1995
JP        2003-223115 A  8/2003
(Continued)

OTHER PUBLICATIONS

International Search Report for PCT/KR2021/095023 mailed on Apr. 28, 2021 and its English Translation from WIPO (now published as WO 2021/158094).
(Continued)

*Primary Examiner* — Lauren Nguyen
(74) *Attorney, Agent, or Firm* — Ladas & Parry, LLP

(57) ABSTRACT

A display device according to one embodiment is a display device in which a first folding area, a first non-folding area on one side of the first folding area, and a second non-folding area on the other side of the first folding area are defined, and comprises a first substrate, a second substrate disposed on the first substrate, a liquid crystal layer disposed between the first substrate and the second substrate, and an upper polarization member disposed on one surface of the second substrate and spaced apart from the liquid crystal layer with the second substrate interposed therebetween, wherein the second substrate has a first thickness, which is partially slimmed, in the first folding area, the second substrate has a second thickness, which is greater than the first thickness and corresponds to an original thickness of a flat display element without being slimmed, in each of the non-folding areas, the upper polarization member is dis-
(Continued)

posed over the first non-folding area, the folding area and the second non-folding area, a first gap distance between one surface of the second substrate and the upper polarization member in the first folding area is greater than a second gap distance between one surface of the second substrate and the upper polarization member in each of the non-folding areas.

16 Claims, 31 Drawing Sheets

(51) Int. Cl.

| | | |
|---|---|---|
| *G02F 1/1368* | (2006.01) | |
| *H10K 59/12* | (2023.01) | |
| *H10K 59/38* | (2023.01) | |
| *H10K 59/80* | (2023.01) | |
| *H10K 102/00* | (2023.01) | |

(52) U.S. Cl.
CPC .......... *G06F 1/1641* (2013.01); *G06F 1/1656* (2013.01); *H10K 59/38* (2023.02); *H10K 59/1201* (2023.02); *H10K 59/8722* (2023.02); *H10K 59/8791* (2023.02); *H10K 2102/311* (2023.02)

(56) References Cited

U.S. PATENT DOCUMENTS

| | | | |
|---|---|---|---|
| 2017/0002331 A1* | 1/2017 | Choo | .................. C12N 5/0081 |
| 2017/0162171 A1 | 6/2017 | Cho | |
| 2019/0137800 A1 | 5/2019 | Lee et al. | |
| 2019/0179470 A1* | 6/2019 | Hong | .................. G09G 3/3275 |

FOREIGN PATENT DOCUMENTS

| | | | | |
|---|---|---|---|---|
| KR | 2012-0013265 | * | 2/2012 | ........... G02F 1/1333 |
| KR | 10-1268471 | | 6/2013 | |
| KR | 10-2015-0013987 | | 2/2015 | |
| KR | 10-2017-0033210 | | 3/2017 | |
| KR | 10-2017-0143355 | | 12/2017 | |

OTHER PUBLICATIONS

Written Opinion of the International Searching Authority for for PCT/KR2021/095023 mailed on Apr. 28, 2021 and its English Translation by Google Translate (now published as WO 2021/158094).

Examination Report No. 1 dated Aug. 2, 2023 for Australian Patent Application No. 2021217315.

Extended European Search Report dated Jan. 25, 2024 for European Patent Application No. 21750973.6.

Office action from corresponding Korean Patent Application No. 10-2020-0014175 dated Jan. 21, 2025, and English translation from Global Dossier.

\* cited by examiner

FIG. 4

PARTIALLY CURVED OR FOLDABLE DISPLAY DEVICE INCLUDING RECESS GROOVES AND MANUFACTURING METHOD THEREFOR

CROSS-REFERENCE TO RELATED APPLICATIONS

This application is the national stage of International Patent Application No. PCT/KR2021/095023 filed on Jan. 20, 2021, which claims priority to Korean Patent Application No. 10-2020-0014175 filed in the Korean Intellectual Property Office on Feb. 6, 2020, the disclosures of which are incorporated by reference herein in their entireties.

TECHNICAL FIELD

The present disclosure relates to a display device, a structure of the display device, and a method of fabricating the same.

BACKGROUND ART

A display device is an electronic device for displaying an image, and studies for a curved display device has been recently made to increase a sense of immersion in an image in accordance with the development of technology.

The curved display device provides a sense of immersion because a surface of viewing an image is bent to give a viewer a feeling as if the viewer is positioned in a space, and a typical curved display device may be fabricated by bending a display panel after a flat panel display device is fabricated to be thin.

In order to fabricate a curved display device, a thickness of the display device may be designed to be thin at the time of initial fabrication, but otherwise, the display device may be bent after a process (hereinafter, referred to as "slimming") such as etching or polishing. The etching process for slimming may be performed by disposing a conductive pattern by an etchant and masking members for preventing damage to a circuit element and spraying or flowing the etchant to members to be etched.

Meanwhile, as a curved display device is recently activated, studies for various arrangements of curved surfaces and flat surfaces have emerged instead of the arrangement simply including a curved surface.

DISCLOSURE

Technical Problem

An object of the present disclosure is to provide a partially curved or foldable display device that may be thin and easily foldable in an area to be folded.

Another object of the present disclosure is to provide a structure of a partially curved or foldable display device, which may be thin and easily foldable, and a method of fabricating the same.

Recently, as a curved display device is activated, there is a need for a folded or bent type display device in which curved surfaces and flat surfaces are mixed to implement more various display devices, in addition to a display device with a simply curved surface. Conventional curved display devices allow an entire display area to maintain a certain thickness to form a curved surface, which facilitates an overall curved surface configuration with a specific radius of curvature. However, when a partially curved or foldable display device, that is, a composite area such as a flat surface, a curved surface (small radius of curvature) and a flat surface exists, a separate device or member needs to be added to each portion, whereby the fabricating time and cost may be required. Also, as a very thin thickness for a very small radius of curvature required only for a folding area is applied to an entire display area, there is a difficulty in slimming, whereby yield is reduced and cost is increased. To solve these problems, the present disclosure is intended to easily fabricate a display device having a composite area.

The objects of the present disclosure are not limited to those mentioned above, and additional objects of the present disclosure, which are not mentioned herein, will be clearly understood by those skilled in the art from the following description of the present disclosure.

Technical Solution

A display device according to one embodiment to achieve the above objects is a display device in which a first folding area, a first non-folding area on one side of the first folding area, and a second non-folding area on the other side of the first folding area are defined, and comprises a first substrate, a second substrate disposed on the first substrate, a liquid crystal layer disposed between the first substrate and the second substrate, and an upper polarization member disposed on one surface of the second substrate and spaced apart from the liquid crystal layer with the second substrate interposed therebetween, wherein the second substrate has a first thickness, which is partially slimmed, in the first folding area, the second substrate has a second thickness, which is greater than the first thickness and corresponds to an original thickness of a flat display element without being slimmed, in each of the non-folding areas, the upper polarization member is disposed over the first non-folding area, the folding area and the second non-folding area, a first gap distance between one surface of the second substrate and the upper polarization member in the first folding area is greater than a second gap distance between one surface of the second substrate and the upper polarization member in each of the non-folding areas.

The first folding area may include a curved shape, and each of the non-folding areas may include a linear shape.

The second substrate may include an upper recess groove recessed toward the first substrate in the first folding area, and one surface of the second substrate and the upper polarization member may be spaced apart from each other with the upper recess groove interposed therebetween.

The display device may further comprise a first reinforcing filling pattern disposed in the upper recess groove and disposed between one surface of the second substrate and the upper polarization member, wherein the first reinforcing filling pattern may be directly in contact with one surface of the second substrate.

A surface of the first reinforcing filling pattern may be positioned on the same plane as one surface of the second substrate in each of the non-folding areas.

The first reinforcement filling pattern may include an organic material, an inorganic material, or a composite material of an organic material and an inorganic material, the second substrate may include glass, a difference in a refractive index between the first reinforcing filling pattern and the second substrate may be within 0.3, and the first reinforcing filling pattern may have light transmittance of 70% or more with respect to a visible light wavelength range.

The first reinforcing filling pattern may include a light shielding material.

The display device may further comprise a lower polarization member disposed on one surface of the first substrate and spaced apart from the liquid crystal layer with the first substrate interposed therebetween, wherein the first substrate may have a third thickness, which is partially slimmed, in the first folding area, and in each of the non-folding areas, the first substrate may have a fourth thinness that is greater than the third thickness and corresponds to an original thickness of a flat display element without being slimmed.

The lower polarization member may be disposed over the first non-folding area, the first folding area and the second non-folding area, and a third gap distance between one surface of the first substrate and the lower polarization member in the first folding area may be greater than a fourth gap distance between one surface of the first substrate and the lower polarization member in each of the non-folding areas.

The first substrate may include a lower recess groove recessed toward the second substrate in the first folding area, and one surface of the first substrate and the lower polarization member may be spaced apart from each other with the lower recess groove interposed therebetween, and the display device may further comprise a second reinforcing filling pattern disposed between one surface of the first substrate and the lower polarization member, wherein the second reinforcement filling pattern may be directly in contact with one surface of the first substrate.

The display device may further comprise a third non-folding area spaced apart from the first folding area with the second non-folding area interposed therebetween, and a second folding area spaced apart from the first folding area with the third non-folding area interposed therebetween.

The second substrate may further include an upper recess groove recessed toward the first substrate in the second folding area, one surface of the second substrate and the upper polarization member may be spaced apart from each other with the upper recess groove of the second substrate of the second folding area, which is interposed therebetween, and the first reinforcement filling pattern may be further disposed in the upper recess groove of the second substrate of the second folding area.

The first substrate may further include a lower recess groove recessed toward the second substrate in the second folding area, one surface of the first substrate and the lower polarization member may be spaced apart from each other with the lower recess groove of the first substrate of the second folding area, which is interposed therebetween, and the second reinforcement filling pattern may be further disposed in the lower recess groove of the first substrate of the second folding area.

A display device according to another embodiment to achieve the above objects is a display device in which a first folding area, a first non-folding area on one side of the first folding area, and a second non-folding area on the other side of the first folding area are defined, and comprises a first substrate, a second substrate disposed on the first substrate, a liquid crystal layer disposed between the first substrate and the second substrate, and an upper polarization member disposed on one surface of the second substrate and spaced apart from the liquid crystal layer with the second substrate interposed therebetween, wherein the first folding area includes a curved shape, and each of the non-folding areas includes a linear shape, the second substrate has a first thickness, which is partially slimmed, in the first folding area, in each of the non-folding areas, the second substrate has a second thickness, which is greater than the first thickness and corresponds to an original thickness of a flat display element without being slimmed, in each of the non-folding areas, the upper polarization member is disposed over the first non-folding area, the folding area and the second non-folding area, and the upper polarization member is disposed in each of the non-folding areas but is not disposed in the first folding area.

The second substrate may include an upper recess groove recessed toward the first substrate in the first folding area.

The display device may further comprise a lower polarization member disposed on one surface of the first substrate and spaced apart from the liquid crystal layer with the first substrate interposed therebetween, wherein the first substrate may have a third thickness, which is partially slimmed, in the first folding area, the first substrate may have a fourth thickness, which is greater than the third thickness and corresponds to an original thickness of a flat display element without being slimmed, in each of the non-folding areas, and the lower polarization member may be disposed in each of the non-folding areas but may not be disposed in the first folding area.

A method of fabricating a display device according to still another embodiment to achieve the above objects comprises preparing a first substrate in which a first area extended along a first direction and a second area positioned on one side and the other side of the first area in a second direction crossing the first direction are defined, a second substrate on the first substrate, a lower polarization member on one surface of the first substrate, and an upper polarization member on one surface of the second substrate, cutting a portion of the lower polarization member and a portion of the upper polarization member, which are overlapped with the first area, attaching a protective film onto each of one surface of the lower polarization member and one surface of the upper polarization member, cutting a portion of the protective film, which is overlapped with the first area, taping the exposed sides of each polarization member and the protective film, and etching one surface exposed from the first area of the first substrate and the second substrate.

The first substrate may be more protruded than the second substrate at one side when preparing the first substrate and the second substrate, and a driving connection film may be attached to the portion of the first substrate, which is more protruded than the second substrate, and the method may further comprise sealing the driving connection film between cutting the lower polarization member and the upper polarization member and attaching the protective film.

The method may further comprise disposing an anti-electrostatic conductive layer between each of the polarization members and each of the substrates when preparing the first substrate and the second substrate, wherein a portion of the anti-electrostatic conductive layer, which is overlapped with the first area, may be cut after each of the polarization members and the protective film are taped, and the exposed side of the anti-electrostatic conductive layer may be taped.

The method may further comprise forming a first reinforcing filling pattern in the lower recess groove, and forming a second reinforcing filling pattern in the upper recess groove.

The method may further comprise forming a polarization member on each of one surface of the first substrate, the first reinforcing filling pattern, one surface of the second substrate and the second reinforcing fill pattern.

After the first substrate and the second substrate are etched, each of the polarization members and the protective film may be delaminated, and a polarization member may be formed on each of one surface of the first substrate and one surface of the second substrate.

A display device according to further still another embodiment to achieve the above objects is a display device in which a first folding area, a first non-folding area on one side of the first folding area, and a second non-folding area on the other side of the first folding area are defined, and comprises a first substrate, a second substrate disposed on the first substrate, a plurality of light emitting elements disposed on the first substrate and disposed between the first substrate and the second substrate, and a functional film disposed on one surface of the second substrate and spaced apart from the first substrate with the second substrate interposed therebetween, wherein the second substrate has a first thickness, which is partially slimmed, in the first folding area, the second substrate has a second thickness, which is greater than the first thickness and corresponds to an original thickness of a flat display element without being slimmed, in each of the non-folding areas, the functional film is disposed over the first non-folding area, the folding area and the second non-folding area, and a first gap distance between one surface of the second substrate and the functional film in the first folding area is greater than a second gap distance between one surface of the second substrate and the functional film in each of the non-folding areas.

The light emitting element may include an organic light emitting element, the first substrate may include a display substrate, and the second substrate may include an encapsulation substrate for sealing the organic light emitting element.

The functional film may include a polarizing layer.

The first folding area may include a curved shape, and each of the non-folding areas may include a linear shape.

The second substrate may include an upper recess groove recessed toward the first substrate in the first folding area, and one surface of the second substrate and the functional film may be spaced apart from each other with the upper recess groove interposed therebetween.

The display device may further comprise a first reinforcing filling pattern disposed in the upper recess groove and disposed between one surface of the second substrate and the functional film, wherein the first reinforcement filling pattern may be directly in contact with one surface of the second substrate.

A surface of the first reinforcing filling pattern may be positioned on the same plane as one surface of the second substrate in each of the non-folding areas.

The first reinforcing filling pattern may include an organic material, the second substrate may include glass, a difference in a refractive index between the first reinforcing filling pattern and the second substrate may be within 0.3, and the first reinforcing filling pattern may have light transmittance of 70% or more with respect to a visible light wavelength range.

The first reinforcing filling pattern may include a light shielding material.

Details of the other embodiments are included in the detailed description and drawings.

Advantageous Effects

In the display device and the method of fabricating the display device according to one embodiment, the display device has a thickness that is thin and may be well folded in a folding area.

A reinforcing filling pattern may be further disposed in the folding area to reinforce strength of a substrate that is vulnerable to a physical damage due to a thin thickness.

The effects according to the embodiment of the present disclosure are not limited to those mentioned above, and more various effects are included in the following description of the present disclosure.

DESCRIPTION OF THE DRAWINGS

FIG. 4 is a cross-sectional view taken along line II-II' of FIG. 1.

MODE FOR DISCLOSURE

Advantages and features of the present disclosure, and implementation methods thereof will be clarified through the following embodiments described with reference to the accompanying drawings. The present disclosure may, however, be embodied in different forms and should not be construed as being limited to the embodiments set forth herein. Rather, these embodiments are provided so that this disclosure will be thorough and complete, and will fully convey the scope of the present disclosure to those skilled in the art. Further, the present disclosure is only defined by the scope of the claims.

A case in which an element or a layer is "on" another element or layer includes all cases in which not only the element or layer are directly on another element or layer but also another element or layer is interposed between the element or layer and the other element or layer. The same reference numbers will be used throughout the disclosure to refer to the same or like parts.

It will be understood that, although the terms such as "first" and/or "second" may be used herein to describe various elements, these elements should not be limited by these terms. These terms are only used to identify one element from another element. Thus, a first element discussed below may be referred to as a second element within technical spirits of the present disclosure.

Figure 1:
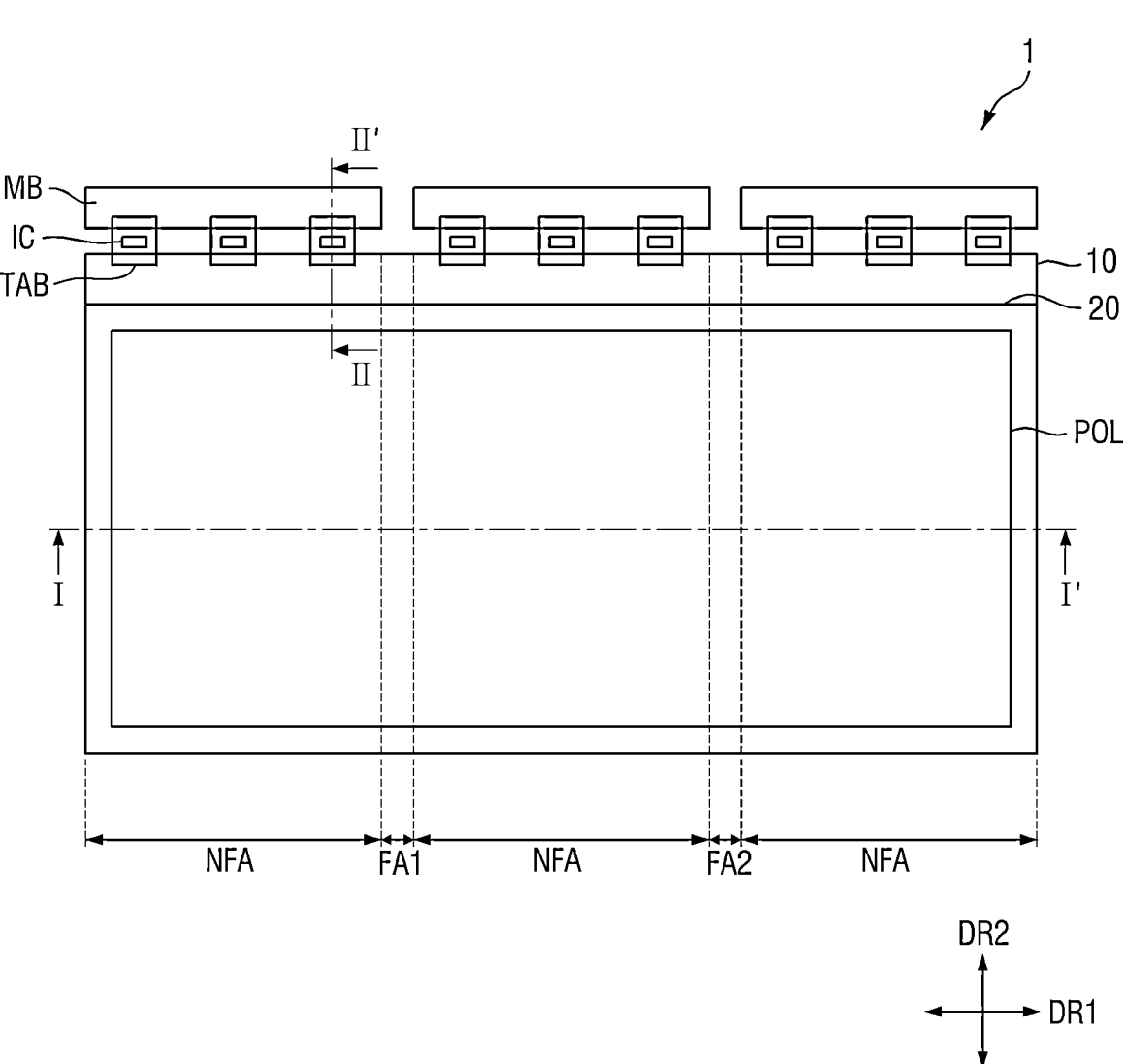
FIG. 1 is a plan view illustrating a display device according to one embodiment.
Figure 2:
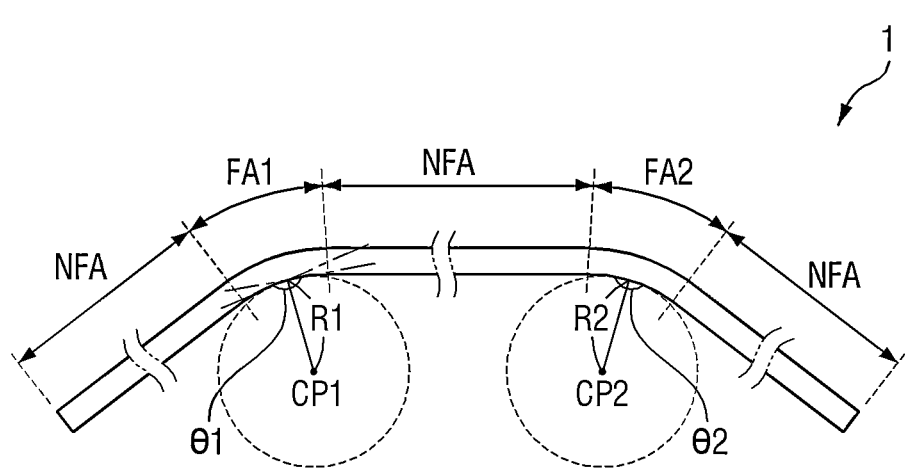
FIG. 2 is a side view illustrating a display device according to one embodiment.
Figure 2:
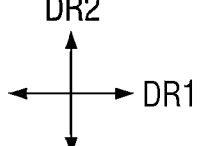
Figure 3:
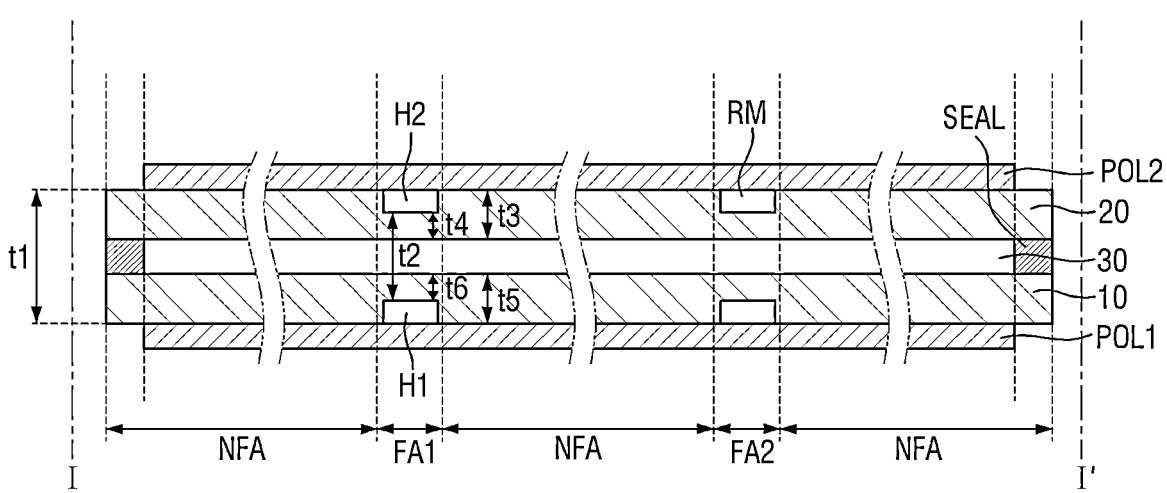
FIG. 3 is a cross-sectional view taken along line I-I' of FIG. 1.
Figure 4:
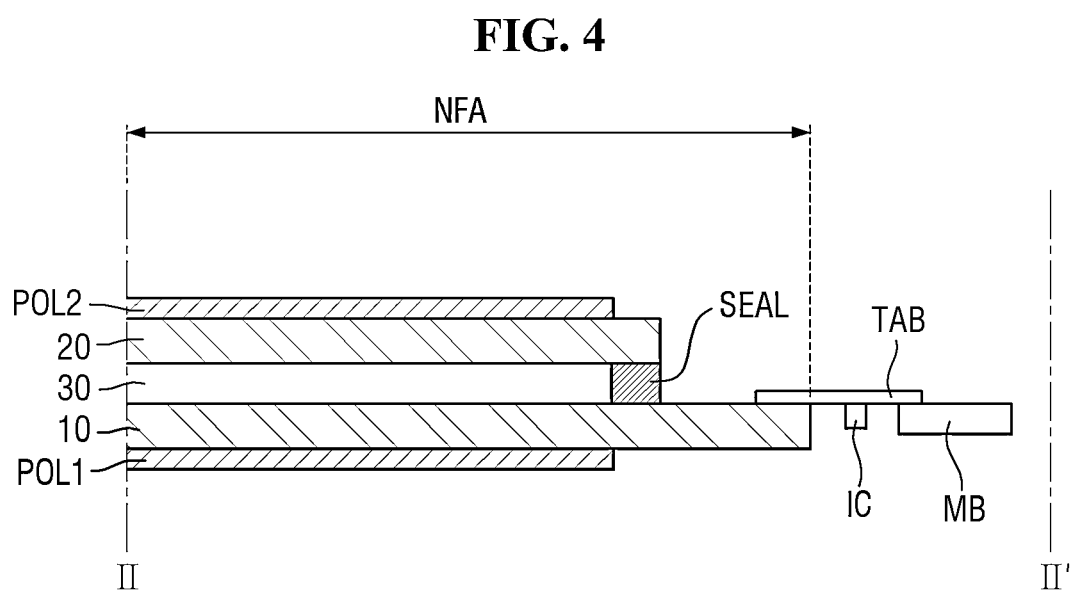
Figure 5:
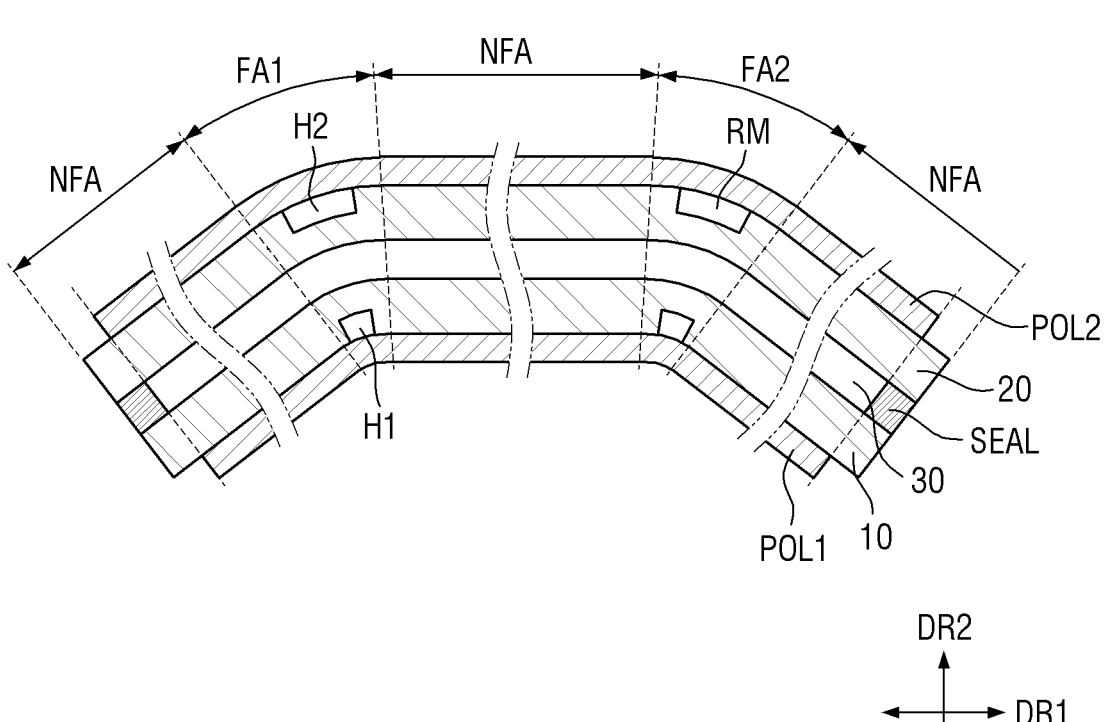
FIG. 5 is a cross-sectional view illustrating a folded state of FIG. 3.
Figure 6:
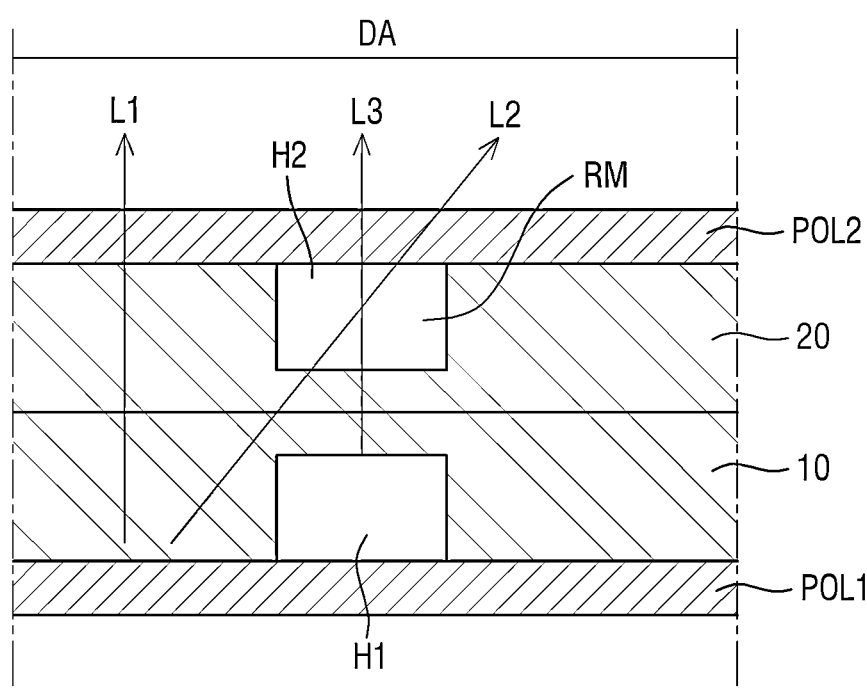
FIG. 6 is a schematic view illustrating movement of light emitted from a first substrate.

Hereinafter, detailed embodiments will be described with reference to the accompanying drawings. FIG. 1 is a plan view illustrating a display device according to one embodiment. FIG. 2 is a side view illustrating a display device according to one embodiment. FIG. 3 is a cross-sectional view taken along line I-I' of FIG. 1. FIG. 4 is a cross-sectional view taken along line II-II' of FIG. 1. FIG. 5 is a cross-sectional view illustrating a folded state of FIG. 3. FIG. 6 is a schematic view illustrating movement of light emitted from a first substrate.

Referring to FIGS. 1 to 6, when a display device 1 includes a display area for displaying an image or a video, it may be interpreted that the display device corresponds to a display device regardless of a main use of the device, an added function, or a name. For example, the display device 1 may include small game consoles, large game consoles such as slot machines used in casino, electronic blackboards, e-books, smart phones, mobile phones, tablet PCs, personal digital assistants (PDAs), portable multimedia players (PMPs), televisions, personal computer monitors, laptop computers, car navigator, car dashboards, digital cameras, camcorders, outdoor billboards, electronic display boards, various medical devices, various inspection devices, various home appliances, which include a display unit, such as a refrigerator and a washing machine, or a device for Internet of Things, but is not limited thereto.

In one embodiment, the display device 1 may have a rectangular shape that includes two long sides (upper and lower sides when a display surface is viewed from the drawing) facing each other, and two short sides (left and right sides when a display surface is viewed from the drawing) facing each other. As shown in FIG. 1, based on a direction of a normal display screen, the display device 1 may have long sides disposed horizontally, but may have long sides disposed vertically.

Three axes of direction are defined in the drawing. A first direction DR1 may be an extension direction of the long side of the display device, the first direction DR1 may be an extension direction of the short side of the display device, and a third direction DR3 may be a thickness direction of the display device. One side in the first direction DR1 may be defined as a right short side of the display device 1, the other side in the first direction DR1 may be defined as a left short side of the display device 1, one side in the second direction DR2 may be defined as an upper long side of the display device 1, and the other side in the second direction DR2 may be defined as a lower long side, but it is to be understood that the directions are defined to be relative.

A liquid crystal display (LCD) device may be applied to the display device 1. Although the liquid crystal display device is described as an example of the display device 1 in the following embodiment, the display device 1 is not limited thereto, and an electrophoresis display (EPD) device, an organic light emitting display (OLED) device, an inorganic EL display device, a plasma display panel (PDP) device, and an electric field emission display (FED) device may be applied to the display device 1.

The display device 1 may include a first substrate 10, a second substrate 20 facing the first substrate 10, and a liquid crystal layer 30 interposed between the first substrate 10 and the second substrate 20. A sealing member SEAL is disposed at edges of the first substrate 10 and the second substrate 20 to couple the first substrate 10 to the second substrate 20 and prevent liquid crystal molecules of the liquid crystal layer 30 from flowing out to the outside.

Any one of the first substrate 10 and the second substrate 20 may be a thin film transistor substrate, and the other one may be a color filter substrate. In the present embodiment, the first substrate 10 is a thin film transistor substrate and the second substrate 20 is a color filter substrate. A display direction may be an outer direction of an upper surface of the second substrate 20. The second substrate 20 may be disposed above the first substrate 100 based on the display direction. Therefore, the second substrate 20 may be an upper substrate, and the first substrate 10 may be a lower substrate.

The first substrate 10, which is a thin film transistor substrate, may be more relatively protruded than the second substrate 20. For example, one end of the first substrate 10 in the second direction DR2 may be more protruded than one end of the second substrate 20 in the second direction DR2. An end portion of the first substrate, which is protruded from one side in the second direction DR2 relative to the second substrate 20, may be defined as an outer area. The outer area may not overlap the second substrate 20. At least a portion of a driver for driving each pixel of the thin film transistor substrate may be disposed in an area where the first substrate 10 protruded from the second substrate 20 is not overlapped with the second substrate 20. For example, the driver may include a driving connection film TAB and a drive circuit board MB connected to the driving connection film TAB. The driving connection film TAB may be attached onto the area where the first substrate 10 is not overlapped with the second substrate 20. That is, the driving connection film TAB may not overlap the second substrate 20. A driving chip IC may be disposed on the driving connection film TAB.

Each of the first substrate 10 and the second substrate 20 may include an insulating substrate made of glass, quartz, or the like, and structures, such as a line, a metal, a semiconductor layer, an insulating layer, a color filter, and a black matrix, which are disposed on the insulating substrate. The structures may be disposed on opposite surfaces of the insulating substrate of the first substrate 10 and the insulating substrate of the second substrate 20, respectively. For convenience, the structure disposed on the insulating substrate is omitted, and only shapes of the insulating substrates of the first substrate 10 and the second substrate 20 are shown. Hereinafter, when referring to a rear shape of the first substrate 10 or the second substrate 20, the corresponding shape may mean the rear shape of the insulating substrate of the first substrate 10 or the rear shape of the insulating substrate of the second substrate 20, but the embodiment of the present disclosure is not limited thereto. Other additional layer may be disposed on the rear surface of the insulating substrate of the first substrate 10 or the second substrate 20, and may include a protruded or recessed area as the corresponding layer is etched or polished.

The driving connection film TAB or a flexible film is attached to one end (i.e., outer area PR) of one side of the first substrate 10 in the second direction DR2. The driving connection film TAB serve to connect the first substrate 10 to the driving circuit board MB or a main circuit board or a main circuit substrate. The driving connection film TAB may be attached onto one surface of the first substrate 10 by interposing a conductive anisotropic film, but the present disclosure is not limited thereto. The driving connection film TAB may be directly attached to one surface of the first substrate 10 through soldering or ultrasonic bonding. The driving connection film TAB is a film that includes a signal line, and may include a flexible film. The driving connection film TAB may be a flexible printed circuit board (FPC), a tab, a connect film, or the like.

The driving circuit board MB may be attached to one end of the driving connection film TAB. The driving connection film TAB and the driving circuit board MB may be attached to each other by a conductive anisotropic film interposed therebetween. When soldering or ultrasonic bonding is used for coupling of the driving connection film TAB and the driving circuit board MB, the conductive anisotropic film may be omitted.

The driving circuit board MB may be formed of a printed circuit board PCB. In some embodiments, the driving chip IC may be disposed on the driving circuit board MB.

In the drawing, the driving circuit board MB and the driving connection film TAB connecting the driving circuit board MB are disposed at one end of the first substrate 10 in the second direction DR2, but the driving circuit board MB and the driving connection film TAB may be disposed at the other end of the first substrate 10 in the second direction DR2, or may be disposed on one side or the other end of the first substrate 10 in the first direction DR1. Also, a plurality of driving circuit boards MB and a plurality of driving connection films TAB may be provided, and may be attached to each other to be adjacent to two or more sides of the first substrate 10.

In one embodiment, one driving circuit board MB may be connected to the first substrate 10 by a plurality of driving connection films TAB. That is, as shown in FIG. 1, a plurality of driving connection films TAB having a width smaller than that of one driving circuit board MB may be attached to one driving circuit board MB. Adjacent driving connection films TAB may be spaced apart from each other.

Meanwhile, a folding area and a non-folding area NFA may be defined in the display device 1 according to one embodiment. The folding area may include a first folding area FA1 and a second folding area FA2 spaced apart from the first folding area FA1.

Each of the folding areas FA1 and FA2 may be extended along the second direction DR2. A non-folding area NFA may be disposed on one side and other side of the first folding area FA1 in the first direction DR1, and a non-folding area NFA may be disposed on one side and other side of the second folding area FA2 in the first direction DR1. That is, the non-folding area NFA, the first folding area FA1, the non-folding area NFA, the second folding area FA2, and the non-folding area NFA may be sequentially disposed along one side direction of the first direction DR1.

Each of the folding areas FA1 and FA2 may be extended from the other end of the display device 1 in the second direction DR2 to one end of the display device 1 in the second direction DR2.

The area except the folding area FA1 and FA2 in the display device 1 may be defined as the non-folding area NFA.

The plurality of driving circuit boards MB attached to one end (one end in the second direction DR2) of the first substrate 10 by the plurality of driving connection films TAB may be disposed in the non-folding area NFA divided by the folding areas FA1 and FA2 of the first substrate 10, and the plurality of driving connection films TAB connected to the corresponding driving circuit board MB may be disposed in the non-folding area NFA.

That is, the plurality of driving connection films TAB and the driving circuit board MB connected with the plurality of driving connection films TAB may be disposed on the other side of the first folding area FA1 of the first substrate 10 in the first direction DR1, and the plurality of driving connection films TAB and the driving circuit board MB connected with the plurality of driving connection films TAB may be disposed on one side (the other side of the second folding area FA2 in the first direction) of the first folding area FA1 of the first substrate 10 in the first direction DR1, and the plurality of driving connection films TAB and the driving circuit board MB connected with the plurality of driving connection films TAB may be disposed on one side of the second folding area FA2 in the first direction DR1.

The driving connection film TAB may not be disposed at one end of the folding area FA1 and FA2 of the first substrate 10 in the second direction DR2.

The first substrate 10 and the second substrate 20 may be folded based on the folding area FA1 and FA2. The non-folding area NFA except the folding areas FA1 and FA2 may maintain a non-folding state without being folded.

That is, in the display device 1 according to one embodiment, as the driving connection film TAB and the drive circuit board MB connected thereto are not disposed in the folding area FA1 and FA2, and the driving connection film TAB and the drive circuit board MB connected thereto are disposed in the non-folding area NFA that maintains a non-folding state without being folded, stress may be prevented from being generated by the driving connection film TAB and the driving circuit board MB connected to the driving connection film TAB in a folded state.

A polarization member POL may be disposed over the non-folding area NFA and the folding areas FA1 and FA2. The polarization member POL disposed over the non-folding area NFA and the folding areas FA1 and FA2 may have an integrally connected shape.

The polarization member POL may be disposed inside the second substrate 20 on a plane. A planar size of the polarization member POL may be smaller than that of the second substrate 20.

The polarization member POL may be the same as or similar to a planar shape of the second substrate 20. The polarization member POL may have a rectangular shape. Short sides of the polarization member POL may be opposite to those of the second substrate 20, and may be positioned inside the short sides of the second substrate 20, and long sides of the polarization member POL may be opposite to those of the second substrate 20, and may be positioned inside the long sides of the second substrate 20.

An area overlapped with the polarization member POL of the display device 1 may be a display area for displaying a screen, and an area that is not overlapped with the polarization member POL may be a non-display area for not displaying a screen.

Referring to FIG. 2, the display device 1 may be folded based on the folding areas FA1 and FA2. That is, the folding areas FA1 and FA2 may be folded with a predetermined curvature. Side shapes of the folding areas FA1 and FA2 folded with a predetermined curvature may have curved shapes. The non-folding area NFA, which is distinguished from the folding areas FA1 and FA2, may not be folded. A side shape of the non-folding area NFA that is not folded may have a linear shape.

A width of each of the folding areas FA1 and FA2 may be smaller than that of the non-folding area NFA. In other words, the width of the non-folding area NFA may be greater than that of each of the folding areas FA1 and FA2. For example, the width of each of the folding areas FA1 and FA2 may be about ½ or less, or about ⅕ or less, or about ⅒ or less of the width of the non-folding area NFA.

When the display device 1 is folded, the non-folding area NFA of the other side of the first folding area FA1 and the non-folding area NFA of one side of the second folding area FA2 may be folded in a lower direction of the third direction DR3. The non-folding area NFA of the other side of the first folding area FA1 and the non-folding area NFA of one side of the first folding area FA1 may face each other, the non-folding area NFA of the other side of the second folding area FA2 and the non-folding area NFA of one side of the second folding area FA2 may face each other, and the non-folding area NFA of the other side of the first folding area FA1 and the non-folding area NFA of one side of the second folding area FA2 may face each other.

The first folding area FA1 may have a first radius of curvature R1 that is a radius of curvature from a first center point CP1, and the second folding area FA2 may have a second radius of curvature R2 that is a radius of curvature from a second center point CP2. The first radius of curvature R1 and the second radius of curvature R2 may be 50*mm* or less, respectively. The first radius of curvature R1 and the second radius of curvature R2 may be equal to each other. In some embodiments, the first radius of curvature R1 and the second radius of curvature R2 may be different from each other.

A first angle θ1 formed by the non-folding areas NFA of one side and the other side of the first folding area FA1 and a second angle θ2 formed by the non-folding areas NFA of one side and the other side of the second folding area FA2 may be greater than 90° and smaller than 180°, respectively. For example, each of the angles θ1 and θ2 may be 135°, but is not limited thereto.

The angles θ1 and θ2 formed by the non-folding areas NFA of one side and the other side of the folding areas FA1 and FA2 may vary depending on the radiuses of curvatures R1 and R2.

That is, as the radiuses of curvatures R1 and R2 become larger, the angles θ1 and θ2 become larger, and as the radiuses of curvatures R1 and R2 become smaller, the angles θ1 and θ2 may be smaller.

In order to fold the substrates 10 and 20, it may be preferably considered that thicknesses of the substrates 10 and 20 are thin in the folding areas FA1 and FA2 in order to minimize bending stress applied when the substrates 10 and 20 are folded.

Referring to FIG. 3, the thicknesses of the substrates 10 and 20 in the folding areas FA1 and FA2 may be smaller than those of the substrates 10 and 20 in the non-folding area NFA.

The thicknesses of the substrates 10 and 20 in the folding areas FA1 and FA2 may be formed by partial slimming.

The substrate 10 and 20 in the non-folding area NFA may maintain the original thicknesses of the substrates 10 and 20 due to non-slimming unlike the partial slimming in the folding areas FA1 and FA2.

In the folding areas FA1 and FA2, the first substrate 10 may include a lower recess groove H1 recessed toward the second substrate 20, and the second substrate 20 may include an upper recess groove H2 recessed toward the first substrate 10.

A width of the lower recess groove H1 and a width of the upper recess groove H2 may be equal to each other. In some embodiments, the width of the lower recess groove H1 and the upper recess groove H2 may be different from each other. For example, the width of the lower recess groove H1 may be greater than that of the upper recess groove H2. As another example, the width of the lower recess groove H1 may be smaller than that of the upper recess groove H2.

In one embodiment, the lower recess groove H1 and the upper recess groove H2 may overlap each other in the thickness direction. In other words, the first substrate 10 and the second substrate 20 may be symmetrical to each other in the thickness direction in view of the arrangement of the recess grooves H1 and H2.

In some embodiments, the first substrate 10 and the second substrate 20 may be asymmetrical to each other in view of the arrangement of the recess grooves. For example, positions of the lower recess groove H1 and the upper recess groove H2 may be different from each other in the thickness direction. For example, the lower recess groove H1 and the upper recess groove H2 may not overlap each other in the thickness direction. For example, the upper recess groove H2 may overlap a space between adjacent lower recess grooves H1 in the thickness direction. Since the space between the adjacent lower recess grooves H1 is positioned in the non-folding area NFA of the first substrate 10, in the illustrated embodiment, the upper recess groove H2 may be positioned in the non-folding area NFA of the first substrate 10. Likewise, the lower recess groove H1 may overlap a space between adjacent upper recess grooves H2 in the thickness direction. Since the space between the adjacent upper recess grooves H2 is positioned in the non-folding area NFA of the second substrate 20, in the illustrated embodiment, the lower recess groove H1 may be positioned in the non-folding area NFA of the second substrate 20.

A thickness t1 from one surface of the first substrate 10 to one surface of the second substrate 20 in the non-folding area NFA may be greater than a thickness t2 from one surface of the first substrate 10 to one surface of the second substrate 20 in the folding areas FA1 and FA2. For example, the thickness t1 from one surface of the first substrate 10 to one surface of the second substrate 20 in the non-folding area NFA may be 1 mm, and the thickness t2 from one surface of the first substrate 10 to one surface of the second substrate 20 in the folding areas FA1 and FA2 may be 0.2 mm, but the thicknesses are not limited thereto.

The second substrate 20 may have a third thickness t3 in the non-folding area NFA, the second substrate 20 may have a fourth thickness t4 in the folding areas FA1 and FA2, the first substrate 10 may have a fifth thickness t5 in the non-folding area NFA, and the first substrate 10 may have a sixth thickness t6 in the folding areas FA1 and FA2.

The third thickness t3 may be greater than the fourth thickness t4, and the fifth thickness t5 may be greater than the sixth thickness t6.

The third thickness t3 and the fifth thickness t5 may be the same as each other, but may be different from each other.

The fourth thickness t4 and the sixth thickness t6 may be the same as each other, but may be different from each other.

The substrates 10 and 20, which are thin in thickness in the folding areas FA1 and FA2, may be more vulnerable to bending stress and/or external impact during folding than in the non-folding area NFA. Although the polarization member POL is further disposed on one surface of the first substrate 10 and one surface of the second substrate 20, respectively, since the thickness of the polarization member POL is substantially uniform regardless of the area, the overall thickness in the folding areas FA1 and FA2 is still smaller than that in the non-folding area NFA, whereby the folding areas may be physically damaged by bending stress and/or external impact.

A reinforcing filling pattern RM may be disposed on one surface of each of the substrates 10 and 20 of the folding areas FA1 and FA2 to improve strength of the folding areas FA1 and FA2 vulnerable to bending stress and/or external impact. The reinforcing filling pattern RM may be disposed in the recess grooves H1 and H2, respectively. The reinforcing fill pattern RM may include an organic material, an inorganic material, or a composite material of an organic material and an inorganic material.

A surface of the reinforcing fill pattern RM may be positioned on the same line as one surface of each of the substrates 10 and 20 of adjacent non-folding areas NFA, but is not limited thereto. The surface of the reinforcing filling pattern RM may be positioned on the same line as one surface of each of the substrates 10 and 20 of the adjacent non-folding areas NFA and may be more protruded or recessed than one surface of each of the substrates 10 and 20.

In the display device 1 according to one embodiment, as the reinforcing filling pattern RM is disposed on one surface of each of the substrates 10 and 20 of the folding areas FA1 and FA2, strength of the folding areas FA1 and FA2 vulnerable to bending stress and/or external impact may be improved.

The reinforcing filling pattern RM may be directly disposed on (in contact with) one surface of each of the substrates 10 and 20, and furthermore, the reinforcing filling pattern RM may be directly disposed on (in contact with) all surfaces of the substrates 10 and 20 of the respective recess grooves H1 and H2.

Polarization members POL1 and POL2 may be disposed on the substrates 10 and 20 and the reinforcing filling pattern RM provided on each of the substrates 10 and 20, respectively. That is, a lower polarization member POL1 may be disposed on the first substrate 10 and one surface of the reinforcing filling pattern RM, and an upper polarization member POL2 may be disposed on the second substrate 20 and one surface of the reinforcing filling pattern RM.

One side and the other side of each of the polarization members POL1 and POL2 in the first direction DR1 may be positioned more inwardly than one side end and the other side end of the substrates 10 and 20 in the first direction DR1, respectively.

Each of the polarization members POL1 and POL2 may not overlap the sealing member SEAL, but is not limited thereto. Each of the polarization members POL1 and POL2 may be disposed to partially overlap the sealing member SEAL.

The lower polarization member POL has a first transmissive axis and a first absorption axis perpendicular to the first transmissive axis. The upper polarization member POL2 has a second transmissive axis and a second absorption axis perpendicular to the second transmissive axis. In one embodiment, the first transmissive axis of the lower polarization member POL1 and the second transmissive axis of the upper polarization member POL2 may be perpendicular to each other, and the first absorption axis of the lower polarization member POL1 and the second absorption axis of the upper polarization member POL2 may be perpendicular to each other, but the present disclosure is not limited thereto. The first transmissive axis and the second transmissive axis may be parallel with each other.

The first transmissive axis of the lower polarization member POL1 may be parallel with the long side of the display device 1, and the second transmissive axis of the upper polarization member POL2 may be parallel with the short side of the display device 1 and perpendicular to the long side of the display device 1. Although not shown, the light provided from a backlight unit on a lower portion of the second substrate 20 passes through the lower polarization member POL1 so that only a first polarization (p-wave) component parallel with the first transmissive axis is incident on the first substrate 10, and a second polarization (s-wave) component parallel with the first absorption axis is absorbed. A phase of the first polarization light incident on the first substrate 10 may be changed by the liquid crystal layer 30. In detail, the degree of phase delay of light passing through the liquid crystal layer 30 is controlled in accordance with an alignment direction (adjusted in accordance with a magnitude of an electric field applied to the liquid crystal layer 30) of the liquid crystal molecules. The light of which phase delay is controlled reaches the upper polarization member POL2, so that only the component corresponding to the second transmissive axis is emitted. For example, when the phase of light is not changed by the liquid crystal layer 30 (i.e., phase delay of 0° or 360°), all of the light are absorbed without passing through the second transmissive axis perpendicular to the corresponding polarization light, and the display device 1 may display black. When the light has phase delay of 180° by the liquid crystal layer 30, a direction of the polarization light is changed to be parallel with the second transmissive axis, accordingly, all of the light are transmitted so that the display device 1 may display white. When the phase delay value has an intermediate value between 0° and 180° or between 180° and 360° by the liquid crystal layer 130, only a portion of the light is transmitted so that the display device 1 may display a gray scale. When the first transmissive axis and the second transmissive axis are parallel with each other, black and white in the above exemplified case will be displayed in reverse.

Each of the polarization members POL1 and POL2 includes a polarizing layer. The polarizing layer may include a polyvinyl alcohol film. The polyvinyl alcohol film may be made of polyvinyl alcohol-based resin. The polyvinyl alcohol-based resin may be obtained, for example, by saponification of a polyvinyl acetate-based resin. Examples of the polyvinyl acetate-based resin may include a vinyl acetate and a copolymer of other monomers copolymerized with the vinyl acetate in addition to the polyvinyl acetate that is a homopolymer of vinyl acetate. Examples of the other monomers copolymerized with the vinyl acetate may include unsaturated carboxylic acids, unsaturated sulfonic acids, olefins, and vinyl ethers. The polyvinyl alcohol film may be fabricated by a flexible method, in which a solution obtained by dissolving a raw solution in water or an organic solvent is flexibly grown, a casting method, an extrusion method, etc. The polarizing layer may further include a dichroic dye such as iodine.

The polarizing layer may be elongated in one direction. The elongation ratio may be 1.15 to 10 times, or 5 to 6.5 times. The dichroic dye may be adsorbed to the polyvinyl alcohol-based resin along the elongation direction of the polarizing layer. The elongation direction of the polarizing layer may be an absorption axis, and its perpendicular direction may be a transmissive axis.

Each of the polarization members POL1 and POL2 may further include a first protective base disposed on one surface of the polarizing layer, a second protective base disposed on the other surface of the polarizing layer, and a bonding layer disposed on the second protective base. One surface of the polarizing layer is a surface directed toward the outside of the display panel 200, and the other surface of the polarizing is a surface opposite to the surface directed toward the outside of the display panel 200, and refers to a surface opposing the liquid crystal panel 200.

The first protective base and the second protective base cover and protect the polarizing layer from both sides in the thickness direction. Each of the first protective base and the second protective base may be made of a film including a thermoplastic resin having excellent transparency, mechanical strength, thermal stability, moisture barrier properties, and isotropic properties. Examples of such thermoplastic resins include cellulose resins such as triacetyl cellulose, polyester resins, polyethersulfone resins, polysulfone resins, polycarbonate resins, polyamide resins, polyimide resins, polyolefin resins, (meta) acrylic resins, cyclic polyolefin resins (norbornene-based resins), polyarylate resins, polystyrene resins, polyvinyl alcohol resins, and mixtures thereof. Although not shown, each of the first protective base and the second protective base may be bonded to the surface of the polarizing layer by a polyvinyl alcohol-based adhesive resin layer.

A bonding layer is disposed on the other surface of the second protective base. The second protective base is disposed between the polarizing layer and the second protective base. Through the bonding layer, the polarization members POL1 and POL2 may be attached to one surface of each of the substrates 10 and 20.

The bonding layer may be a viscosity layer that includes a glue, or an adhesive layer that includes an adhesive. As a component material of the bonding layer, a polymer such as an acryl-based polymer, a silicon-based polymer, polyester, polyurethane, polyamide, polyether, fluorine-based polymer or rubber-based polymer may be appropriately selected and used as a base polymer. In particular, it is preferable to use a material having excellent optical transparency, suitable wettability, cohesive and adhesive properties, and excellent weather resistance and heat resistance, such as acrylic adhesive.

Each of the polarization members POL1 and POL2 may be disposed over the non-folding area NFA and the folding areas FA1 and FA2. The reinforcing filling pattern RM may be disposed between the lower polarization member POL1 and the first substrate 10, and may be also disposed between the upper polarization member POL2 and the second substrate 20.

As the polarization members POL1 and POL2 are disposed over the non-folding area NFA and the folding areas FA1 and FA2, the light generated from the backlight unit over the folding areas FA1 and FA2 and the non-folding area NFA of the display device 1 may be emitted toward an upper direction of the upper polarization member POL2 through an area overlapped with the polarization members POL1 and POL2.

Meanwhile, since the reinforcing filling pattern RM is disposed in a light path through which light generated by the backlight unit is emitted toward the upper direction of the upper polarization member POL2, when a difference in a refractive index from the second substrate 20 becomes smaller, the light may tend to be less refracted and reflected on an interface between the second substrate 20 and the reinforcing fill pattern RM. To this end, it is preferable that the reinforcement filling pattern RM has a small difference in a refractive index from the second substrate 20. For example, the difference in the refractive index between the reinforcing filling pattern RM and the second substrate 20 may be within about 0.3.

In addition, since the reinforcing filling pattern RM is disposed in a light path through which the light generated by the backlight unit is emitted toward the upper direction of the upper polarization member POL2, it is preferable that the reinforcing filling pattern RM has good light transmittance for a visible light wavelength range in view of display efficiency. In this respect, light transmittance for the visible light wavelength range of the reinforcing filling pattern RM may be 70% or more.

A gap distance of the polarization members POL1 and POL2 from the adjacent substrates 10 and 20 in the folding areas FA1 and FA2 may be greater than a gap distance of the polarization members POL1 and POL2 from the adjacent substrates 10 and 20 in the non-folding area NFA. This is because the substrates 10 and 20 have respectively recess grooves H1 and H2 in the folding areas FA1 and FA2, and the polarization members POL1 and POL2 are disposed to be spaced apart from the substrates 10 and 20 with the recess grooves H1 and H2 interposed therebetween.

Referring to FIG. 5, as described above in FIG. 2, the display device 1 may be folded based on the folding areas FA1 and FA2. That is, the folding areas FA1 and FA2 may be folded with a predetermined curvature. Side shapes of the folded folding areas FA1 and FA2 folded with a predetermined curvature may have curved shapes. The non-folding area NFA, which is distinguished from the folding areas FA1 and FA2, may not be folded. A side shape of the non-folding area NFA that is not folded have a linear shape.

Referring to FIG. 6, light L1, L2 and L3 generated from the backlight unit that is not shown may be emitted toward the upper direction of the upper polarization member POL2 with different routes. The first light L1 sequentially passes through the first substrate 10, the second substrate 20, and the upper polarization member POL2, and the second light L2 and the third light L3 sequentially pass through the first substrate 10, the reinforcement filling pattern RM, and the upper polarization member POL2. The second light L2 passes through the first substrate 10, the reinforcement filling pattern RM, and the upper polarization member POL2 substantially perpendicular to the first substrate 10, whereas the third light L3 may pass through the first substrate 10, the reinforcement filling pattern RM, and the upper polarization member POL2 obliquely from the first substrate 10.

As described above, the reinforcing filling pattern RM may be disposed in a light path through which the light generated by the backlight unit is emitted toward the upper direction of the upper polarization member POL2. In order to perform a display area function even in the area (the folding areas FA1 and FA2) where the reinforcing filling pattern RM is disposed, the reinforcing filling pattern RM according to one embodiment may have a refractive index difference of about 0.3 or less from the second substrate 20, and light transmittance for the visible light wavelength range may be 70% or more.

Hereinafter, another embodiment will be described.

Figure 7:
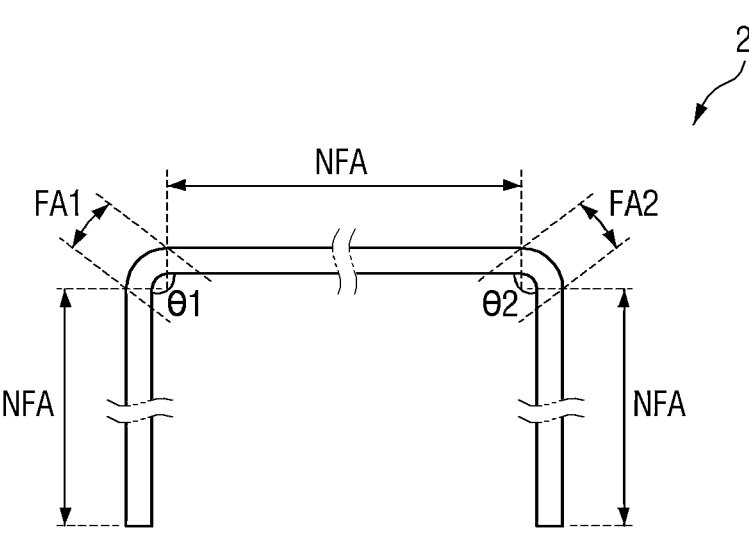
FIG. 7 is a side view illustrating a display device according to another embodiment.
Figure 8:
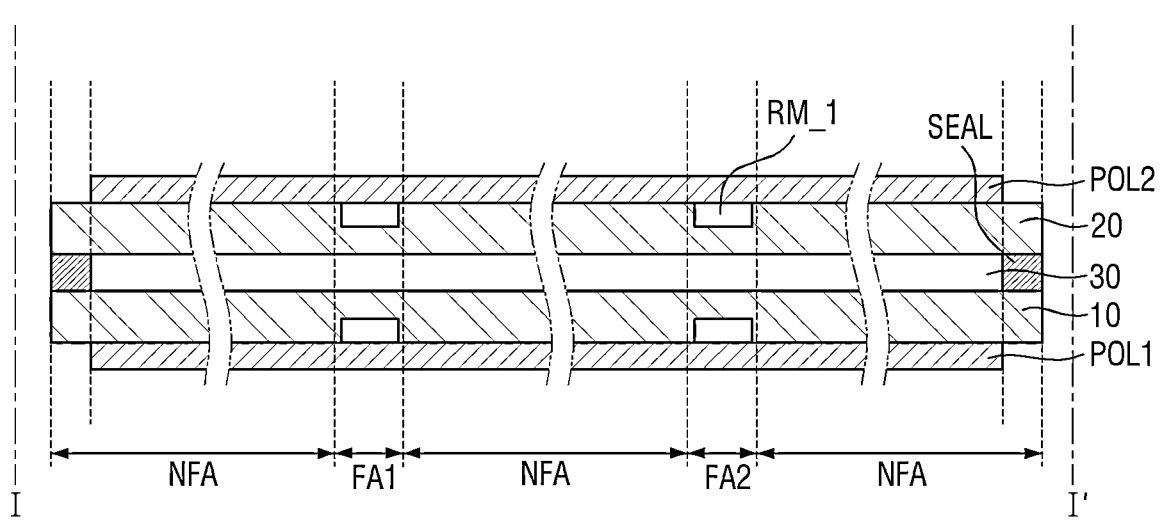
FIG. 8 is a cross-sectional view illustrating the display device according to FIG. 7.

FIG. 7 is a side view illustrating a display device according to another embodiment. FIG. 8 is a cross-sectional view illustrating the display device according to FIG. 7.

Referring to FIGS. 7 and 8, a display device 2 according to the present embodiment is different from the display device 1 according to one embodiment in that the first angle θ1 formed by the non-folding areas NFA of one side and the other side of the first folding area FA1 and the second angle θ2 formed by the non-folding areas NFA of one side and the other side of the second folding area FA2 are smaller than 90°.

In more detail, in the display device 2 according to the present embodiment, the first angle θ1 formed by the non-folding areas NFA of one side and the other side of the first folding area FA1 and the second angle θ2 formed by the non-folding areas NFA of one side and the other side of the second folding area FA2 may be smaller than 90°.

According to the present embodiment, in the folding areas FA1 and FA2, light emitted from the non-folding area NFA between the folding areas FA1 and FA2 and the non-folding area NFA of the other side of the first folding area FA1 or light emitted from the non-folding area NFA between the folding areas FA1 and FA2 and the non-folding area NFA of one side of the second folding area FA2 may interfere with each other to generate screen distortion.

In order to improve the screen distortion, it may be considered that a reinforcing fill pattern RM_1 disposed in the recess grooves H1 and H2 of the substrates 10 and 20 in the folding areas FA1 and FA2 includes a light shielding material. That is, in the present embodiment in which the first angle θ1 formed by the non-folding areas NFA of one side and the other side of the first folding area FA1 and the second angle θ2 formed by the non-folding areas NFA of one side and the other side of the second folding area FA2 are smaller than 90°, the reinforcement filling pattern RM_1 may include a light absorbing material or a light shielding material. For example, the reinforcement filling pattern RM_1 may include a material used as a black matrix of the display device.

Figure 9:
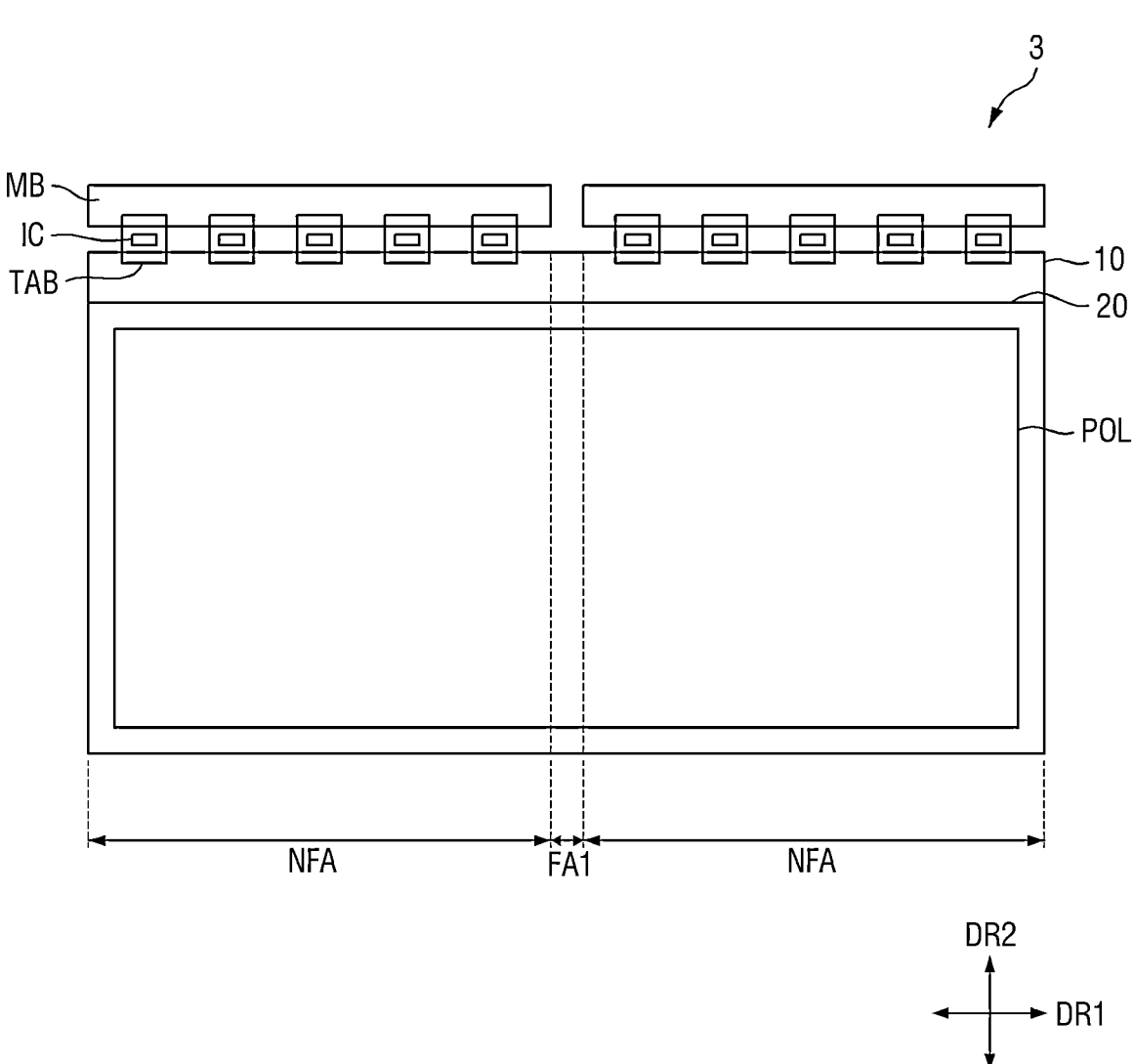
FIG. 9 is a plan view illustrating a display device according to another embodiment.
Figure 10:
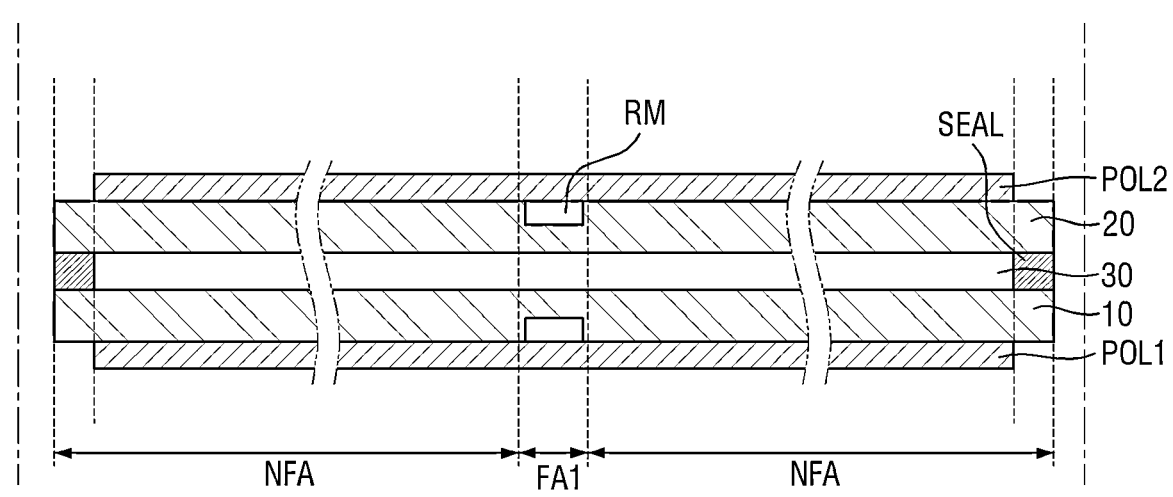
FIG. 10 is a cross-sectional view illustrating the display device according to FIG. 9.

FIG. 9 is a plan view illustrating a display device according to another embodiment. FIG. 10 is a cross-sectional view illustrating the display device according to FIG. 9.

Referring to FIGS. 9 and 10, a display device 3 according to the present embodiment is different from the display device 1 according to one embodiment in that the folding area includes only the first folding area FA1.

In more detail, in the display device 3 according to the present embodiment, the folding area may include only the first folding area FA1.

Since the other elements are as described above, their repeated description will be omitted.

Figure 11:
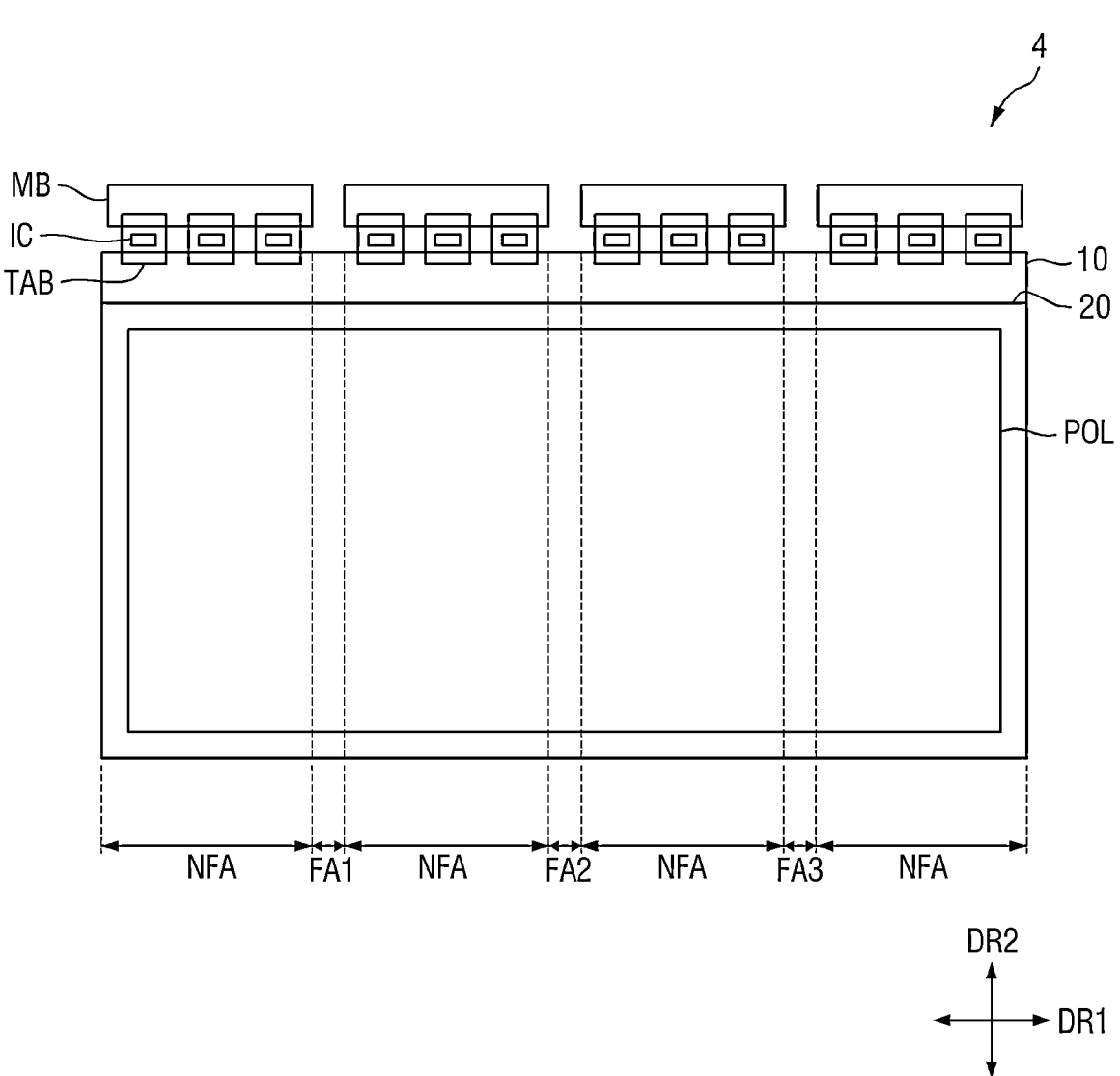
FIG. 11 is a plan view illustrating a display device according to still another embodiment.
Figure 12:
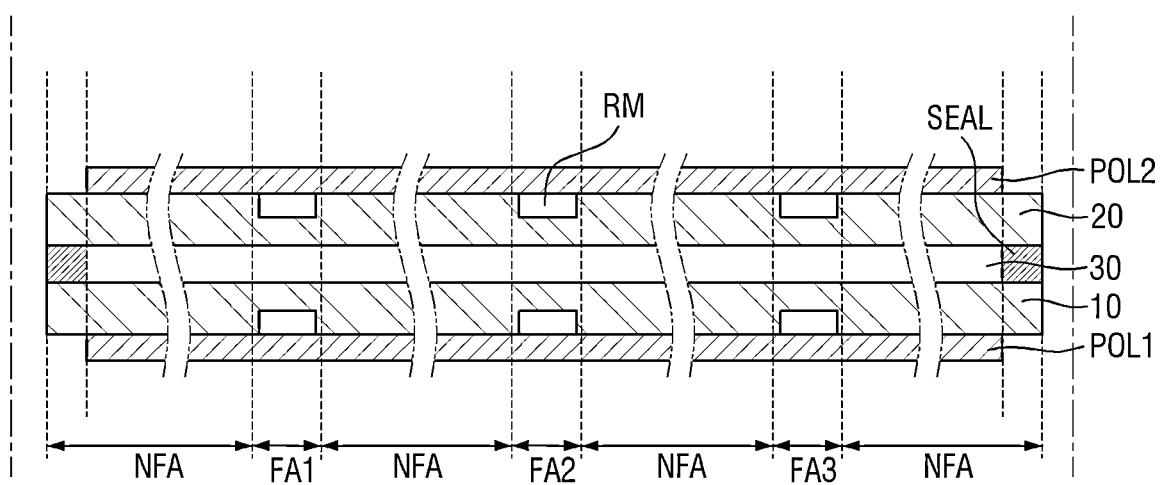
FIG. 12 is a cross-sectional view illustrating the display device according to FIG. 11.

FIG. 11 is a plan view illustrating a display device according to still another embodiment. FIG. 12 is a cross-sectional view illustrating the display device according to FIG. 11.

Referring to FIGS. 11 and 12, a display device 4 according to the present embodiment is different from the display device 1 according to one embodiment in that the folding area further includes a third folding area FA3.

In more detail, in the display device 4 according to the present embodiment, the folding area may further include a third folding area FA3.

The third folding area FA3 may be disposed to be spaced apart from one side of the first folding area FA1 in the first direction DR1 with the non-folding area NFA interposed therebetween.

Since the other elements are as described above, their repeated description will be omitted.

Figure 13:
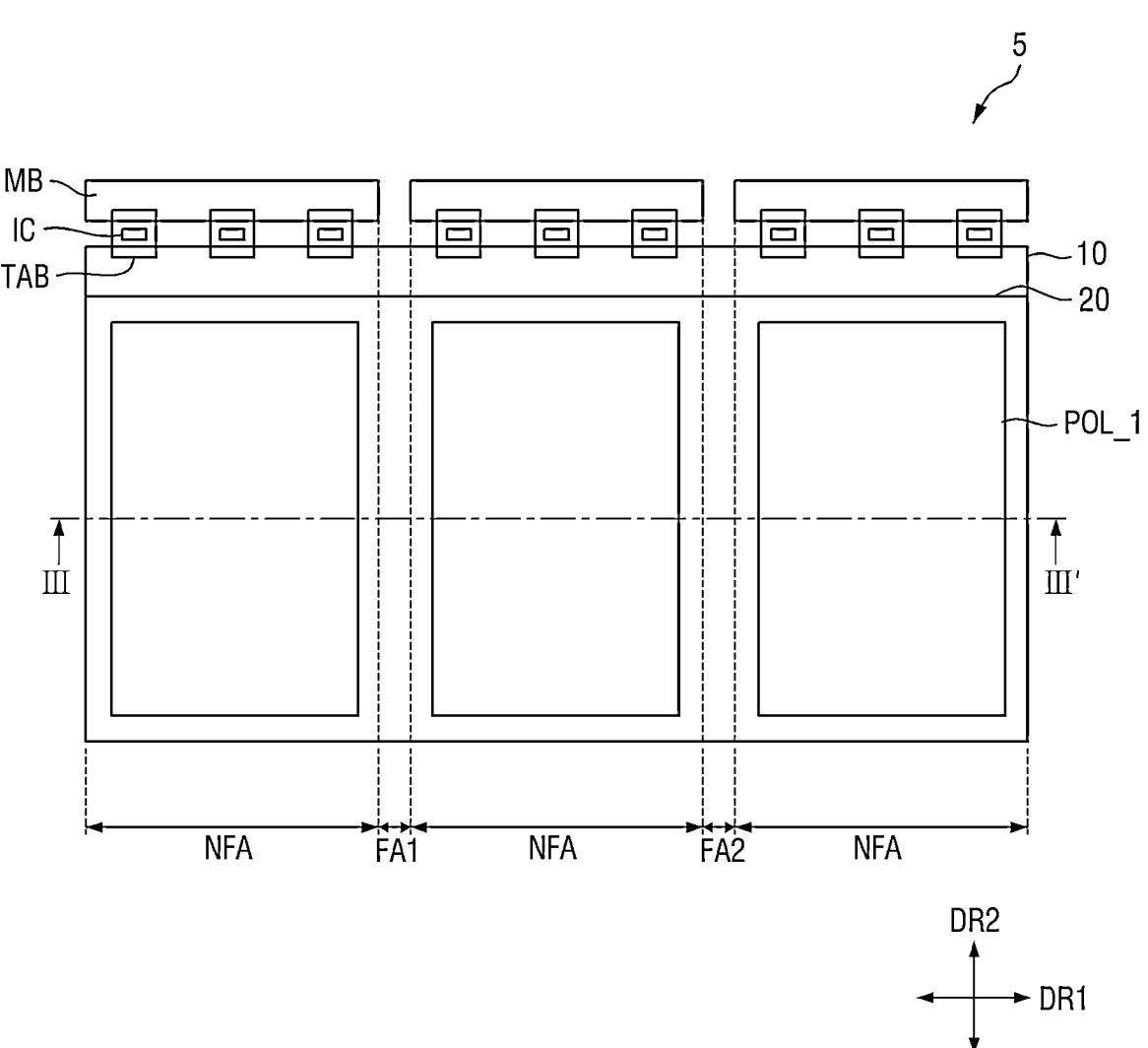
FIG. 13 is a plan view illustrating a display device according to further still another embodiment.
Figure 14:
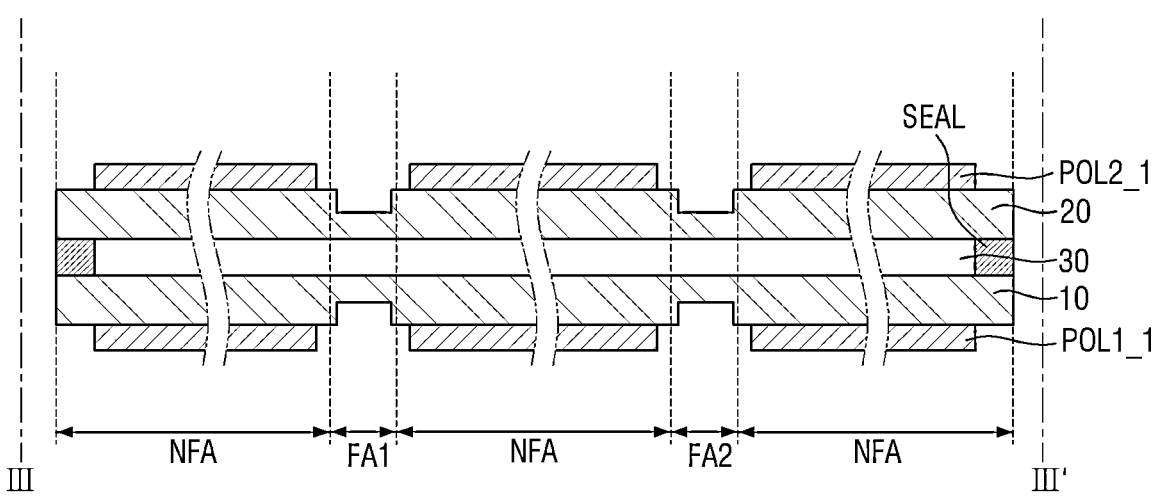
FIG. 14 is a cross-sectional view taken along line III-III' of FIG. 13.

FIG. 13 is a plan view illustrating a display device according to further still another embodiment. FIG. 14 is a cross-sectional view taken along line of FIG. 13.

Referring to FIGS. 13 and 14, a display device 5 according to the present embodiment is different from the display device 1 according to one embodiment in that each of polarization members POL_1:POL1_1 and POL2_1 is disposed only in the non-folding area NFA without being disposed in the folding areas FA1 and FA2, and the reinforcement filling pattern RM is omitted.

In more detail, in the display device 5 according to the present embodiment, each of the polarization members POL_1:POL1_1 and POL2_1 may be disposed only in the non-folding area NFA without being disposed in the folding areas FA1 and FA2, and the reinforcement filling pattern RM may be omitted.

Each of the polarization members POL1_1 and POL2_1 may be positioned inside each of the non-folding areas NFA. That is, one side and the other side of each of the polarization members POL1_1 and POL2_1 may be positioned more inwardly than a side of the non-folding area NFA adjacent thereto.

The folding areas FA1 and FA2 of the display device 1 according to the present embodiment may be a non-display area in which a screen is not displayed.

Hereinafter, a method of fabricating a display device according to one embodiment of the present disclosure will be described.

Figure 15:
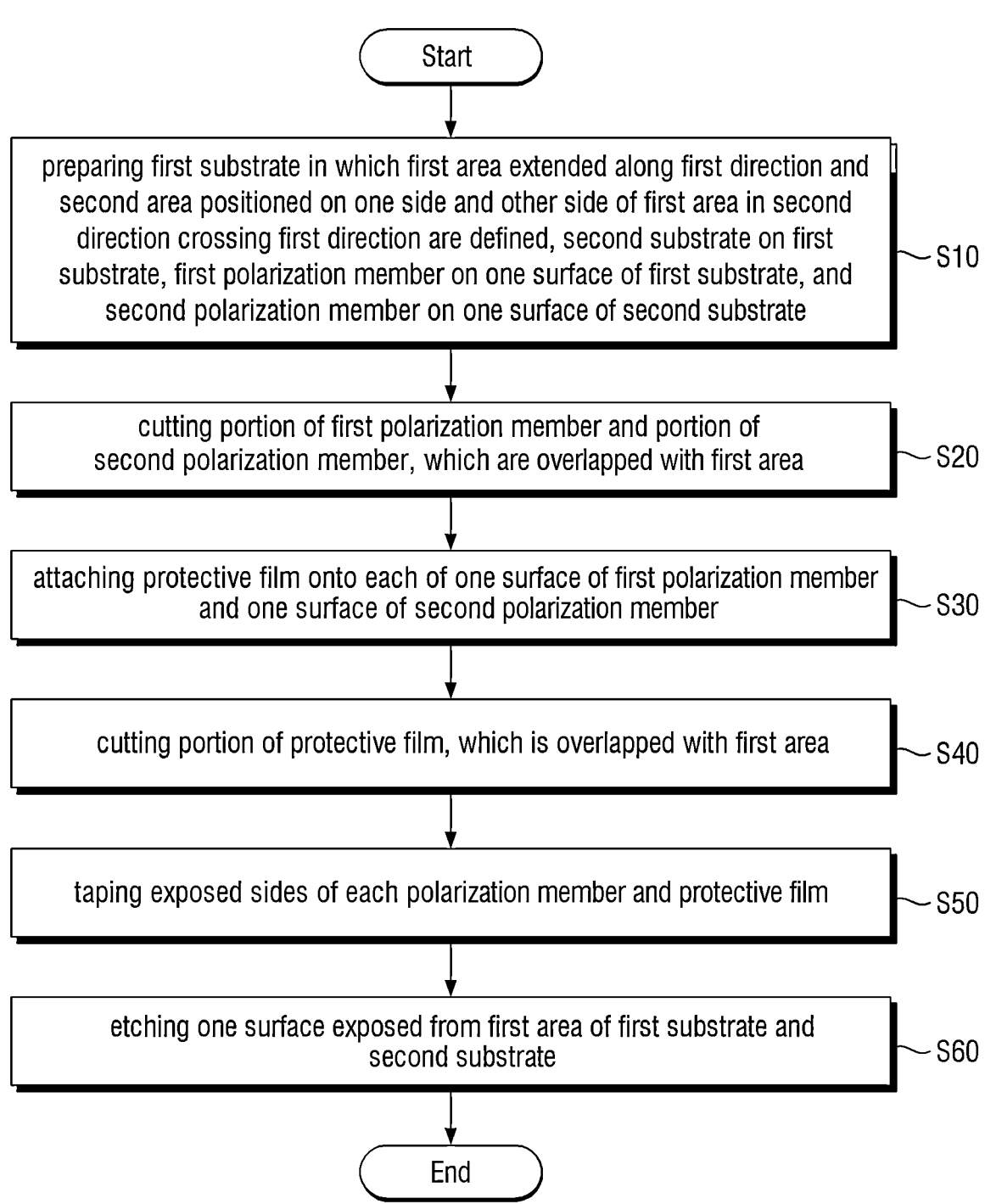
FIG. 15 is a flow chart illustrating a method of fabricating a display device according to one embodiment.
Figure 20:
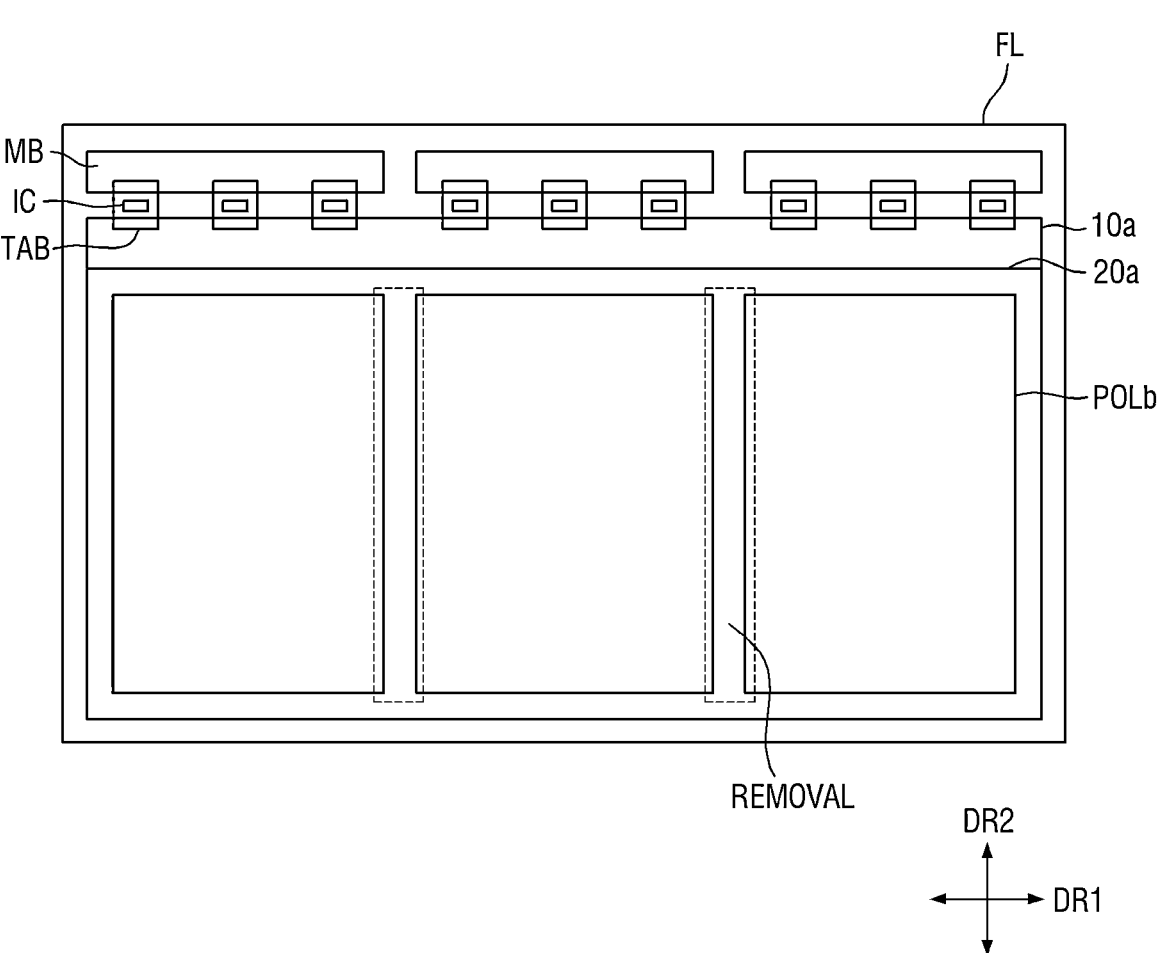
Figure 21:
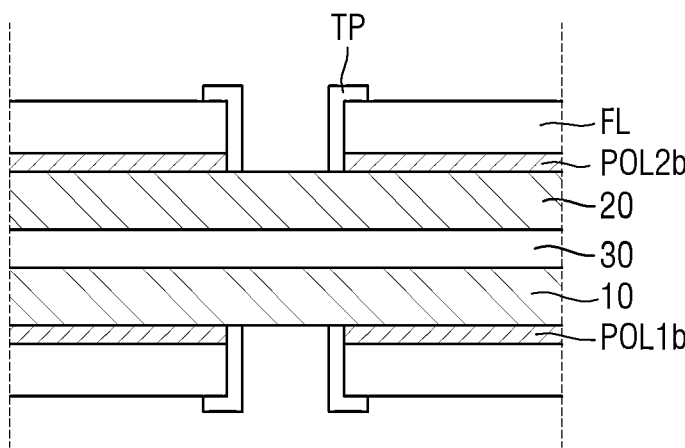
Figure 22:
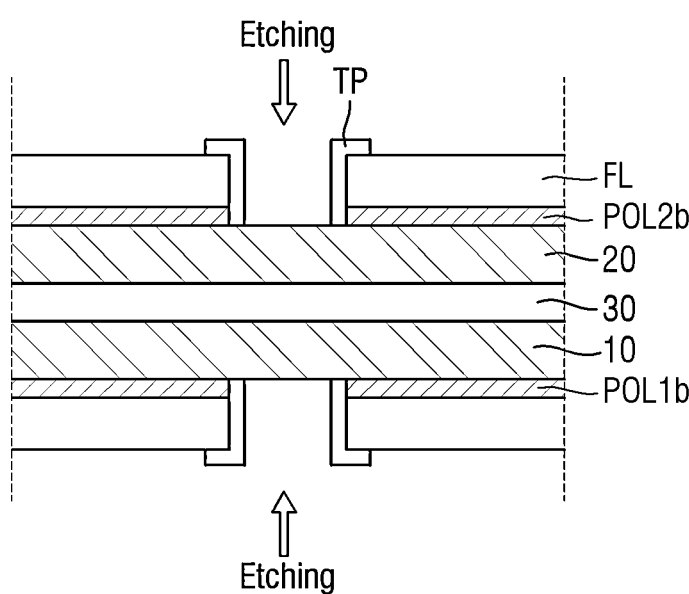

FIG. 15 is a flow chart illustrating a method of fabricating a display device according to one embodiment. FIGS. 16, 17, 19 and 20 are plan views illustrating process steps of a method of fabricating a display device according to one embodiment. FIGS. 18, 21 and 22 are cross-sectional views illustrating process steps of a method of fabricating a display device according to one embodiment.

Figure 16:
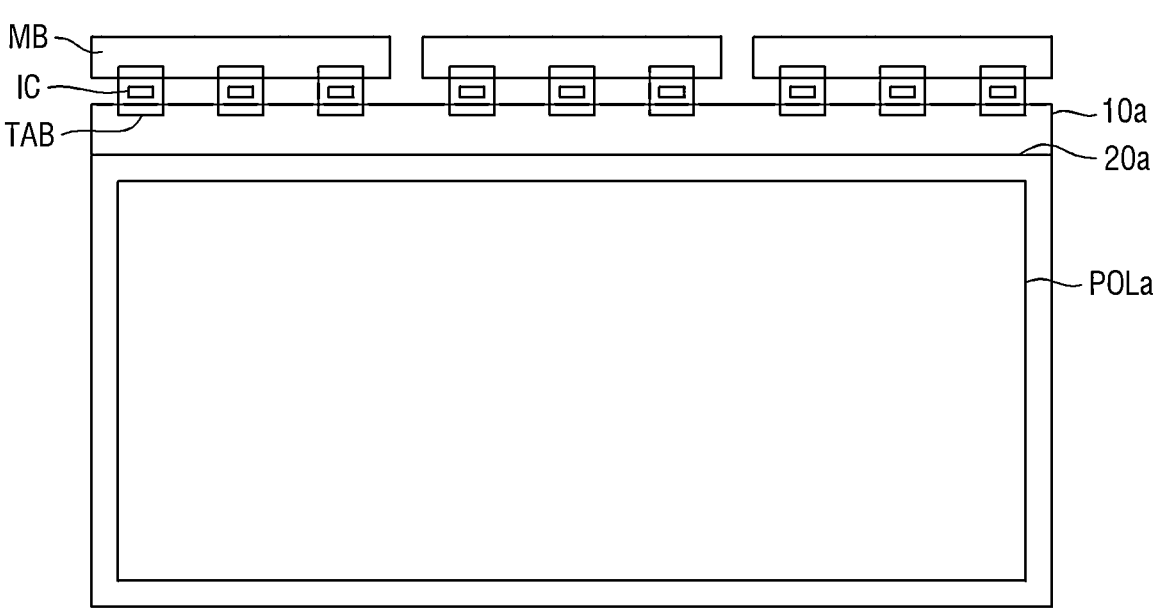
FIGS. 16, 17, 19 and 20 are plan views illustrating process steps of a method of fabricating a display device according to one embodiment.
Figure 16:
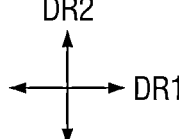

Referring to FIGS. 15 and 16, a first substrate 10a, a second substrate 20a, and a polarization member POLa are prepared (S10). The first substrate 10a and the second substrate 20a are substantially the same as the first substrate 10 and the second substrate 20 described above in FIG. 1 except that the recess grooves H1 and H2 are not included therein.

In the same as FIG. 3, the polarization member POLa may be disposed on each of one surface of the first substrate 10a and one surface of the second substrate 20a. The polarization member POLa may be disposed over folding areas ('FA1' and 'FA2' of FIG. 1) and a non-folding area ('NFA' of FIG. 1).

The polarization member POLa may be a member different from the polarization member POL described in FIG. 1 in that it is cut in the folding areas (see 'FA1' and 'FA2' of FIG. 1) and then delaminated after slimming of the substrates 10a and 20a.

Figure 17:
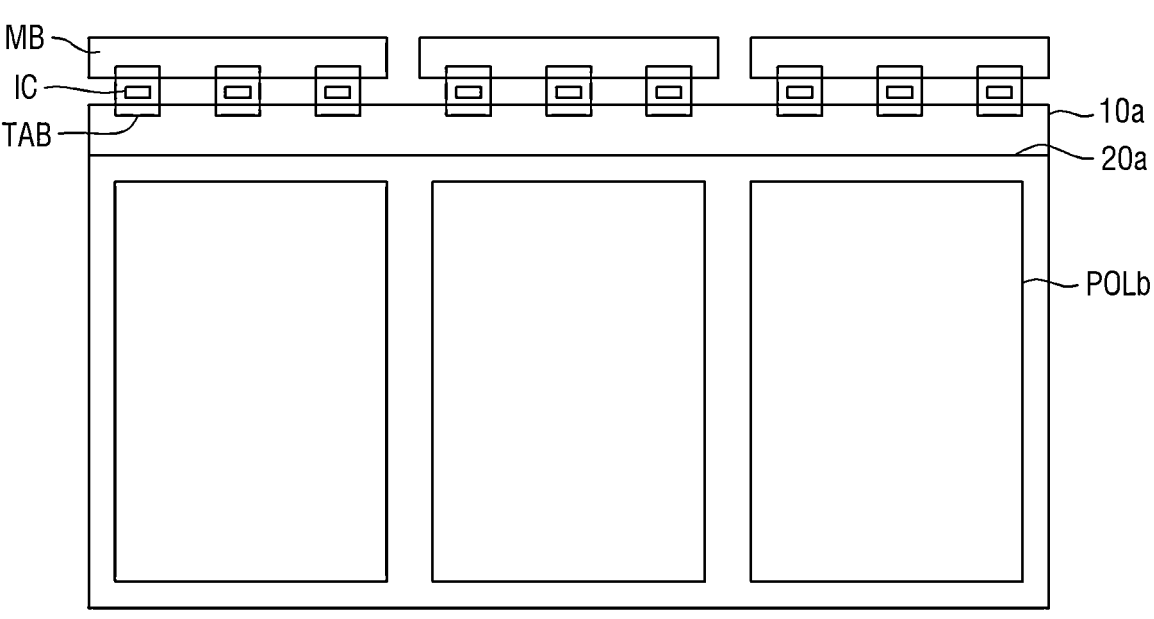
Figure 17:
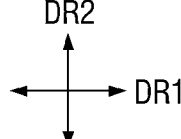
Figure 18:
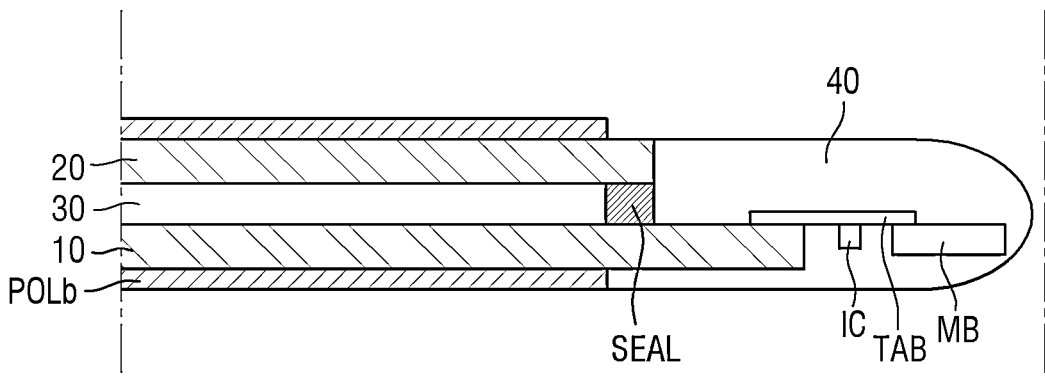
FIGS. 18, 21 and 22 are cross-sectional views illustrating process steps of a method of fabricating a display device according to one embodiment.

Referring to FIGS. 15 and 17, the polarization member POLa disposed on each of one surface of the first substrate 10a and one surface of the second substrate 20a is cut in the folding areas (see 'FA1' and 'FA2' of FIG. 1) to form a plurality of polarization members POLb spaced apart from each other along the first direction DR1 (S20). One surface of each of the substrates 10a and 20a may be exposed in a gap space of adjacent polarization members POLb.

Although not shown in FIG. 17, the above-described cutting process may be performed for the polarization member POLa disposed on each of one surface of the first substrate 10a and one surface of the second substrate 20a.

Then, referring to FIGS. 15 and 18, a sealing member 40 is formed on an outer area of the first substrate 10a. The sealing member 40 may be formed on one surface of the outer area of the first substrate 10a and may cover and protect a driving connection film TAB and an entire driving circuit board MB. Through the present process, the driving connection film TAB and the driving circuit board MB may be prevented from being damaged by an etchant in a later etching process.

In the present embodiment, an etching process will be described as an example of slimming.

Figure 19:
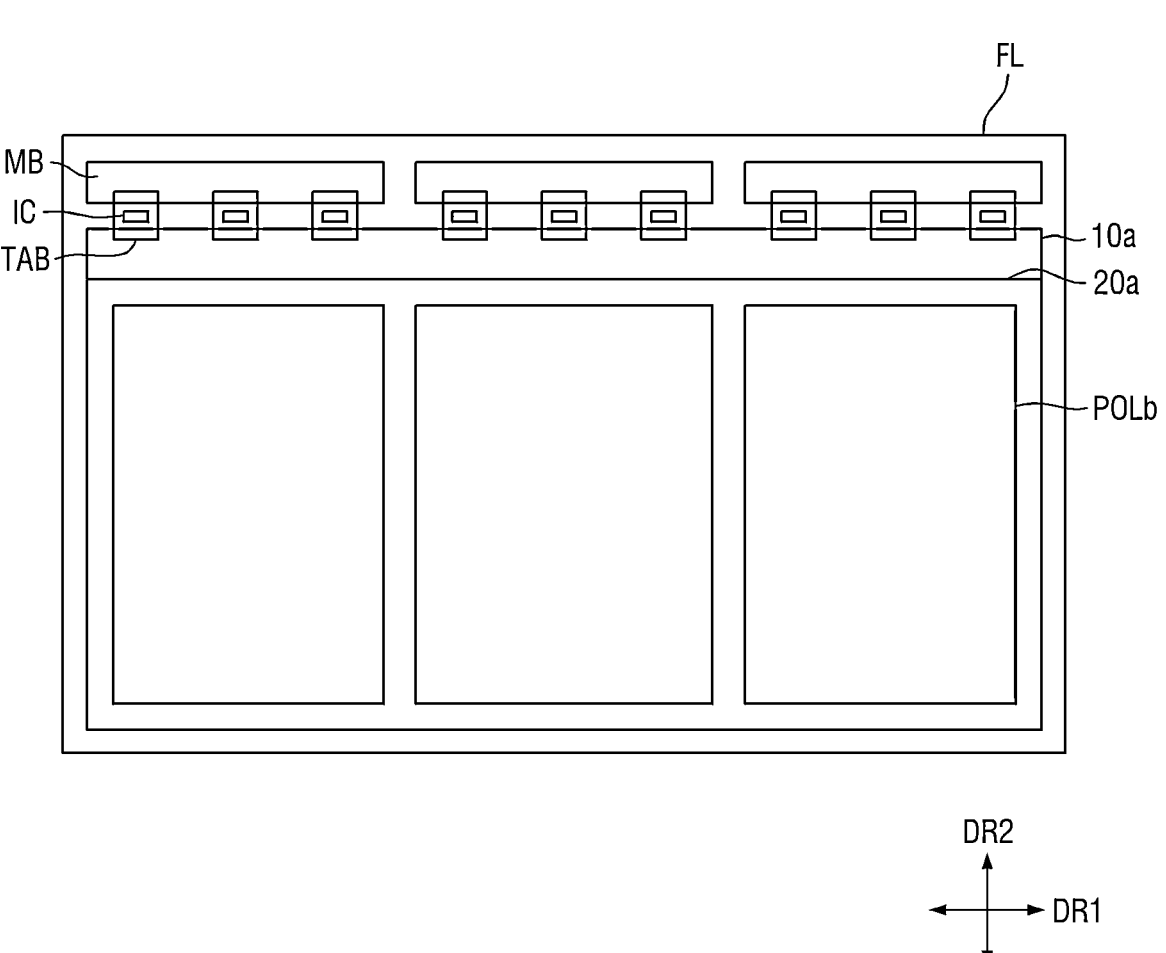

Referring to FIGS. 15 and 19, a protective film FL is formed on one surface of the polarization member POLb disposed on each of one surface of the first substrate 10*a* and one surface of the second substrate 20*a* (S30). The protective film FL may be disposed to overlap and cover exposed surfaces of the substrates 10*a* and 20*a* in the gap space of the adjacent polarization members POLb.

Subsequently, referring to FIGS. 15 and 20, the folding areas (see 'FA1' and 'FA2' of FIG. 1) of the protective film FL are removed by cutting (S40). An inner side of the protective film FL, which is exposed by cutting, may be aligned with an inner side of the polarization member POLb, which is exposed by cutting.

In the corresponding area of the cut protective film FL, one surface of each of the substrates 10*a* and 20*a* may be exposed.

Referring to FIG. 15 and FIG. 21, the exposed sides of the polarization members POL1*b* and POL2*b* and the protective film FL are masked (S50). A tape TP, which is widely known in the art, may be used as a masking member. When the tape TP is used as the masking member, a masking step may be referred to as a taping step.

The tape TP may sequentially tape a portion of one surface of each of the substrates 10*a*, 20*a*, the exposed inner sides of the polarization members POL1*b* and POL2*b*, and the exposed inner side of the protective film FL, and may be partially disposed on one surface of the protective film FL.

The other portions of one surface of the protective film FL and one surface of each of the substrates 10*a* and 20*a* may be exposed by the tape TP.

Subsequently, the other non-folding areas NFA except for the folding areas FA1 and FA2 of FIG. 1 are masked.

Subsequently, referring to FIGS. 15 and 22, the folding areas FA1 and FA2 of the substrates 10*a* and 20*a* are etched (S60). Through this process, the substrates 10 and 20 having the recess grooves H1 and H2 of FIG. 3 may be formed.

Afterwards, the polarization member POLb and the protective film FL are delaminated.

Subsequently, as shown in FIG. 15 and FIG. 3, the filling reinforcement pattern RM is formed on each of the etching areas (or recess grooves H1 and H2) of the substrates 10 and 20.

Subsequently, the polarization member is disposed on an entire surface over the non-folding area NFA and the folding area FA.

In some embodiments, when a conductive layer for performing an anti-electrostatic function is further disposed between the polarization member POLb and the substrates 10*a* and 20*a*, after masking the exposed sides of the polarization members POL1*b* and POL2*b* and the protective film FL, a process of delaminating the conductive layer and masking the exposed side of the conductive layer may be further performed.

In some embodiments, a polishing process may be performed instead of etching. The sealing member arrangement and taping described above in the embodiment where the polishing process is performed may be omitted, but the present disclosure is not limited thereto.

In the conventional curved display device, the entire display area maintains a certain thickness (smaller than the non-display area) so that the entire display area may constitute a curved surface, whereby a specific radius of curvature (one radius of curvature or a plurality of radiuses of curvatures) may be obtained.

However, when a partial curved surface or folded type (mixture of a partial curved surface and a flat surface) is applied to the conventional curved display device (display device in which an entire display area is curved), a device or member capable of maintaining a flat surface to prevent a thin thickness portion from being bent should be added to the flat surface portion. This may lead to a risk of additional costs by increasing the complexity of the fabricating process and the fabricating process time. In addition, as the slimming process of the entire display area is performed, the slimming process time and material consumption may be significantly caused.

However, in case of the method of fabricating a partially curved or foldable display device (mixture of a partial curved surface and a flat surface) according to the present embodiment, partial slimming may be performed for only the folded area (area to which the partially curved surface or the foldable type is applied). This means that the arrangement of the device or member for maintaining a flat surface, which is exemplified to apply the partially curved surface or the foldable type to the conventional curved display device, and sliming of the entire display area may be omitted.

Hereinafter, a case that the display device according to the above-described embodiments is applied to an organic light emitting display device will be described.

Figure 23:
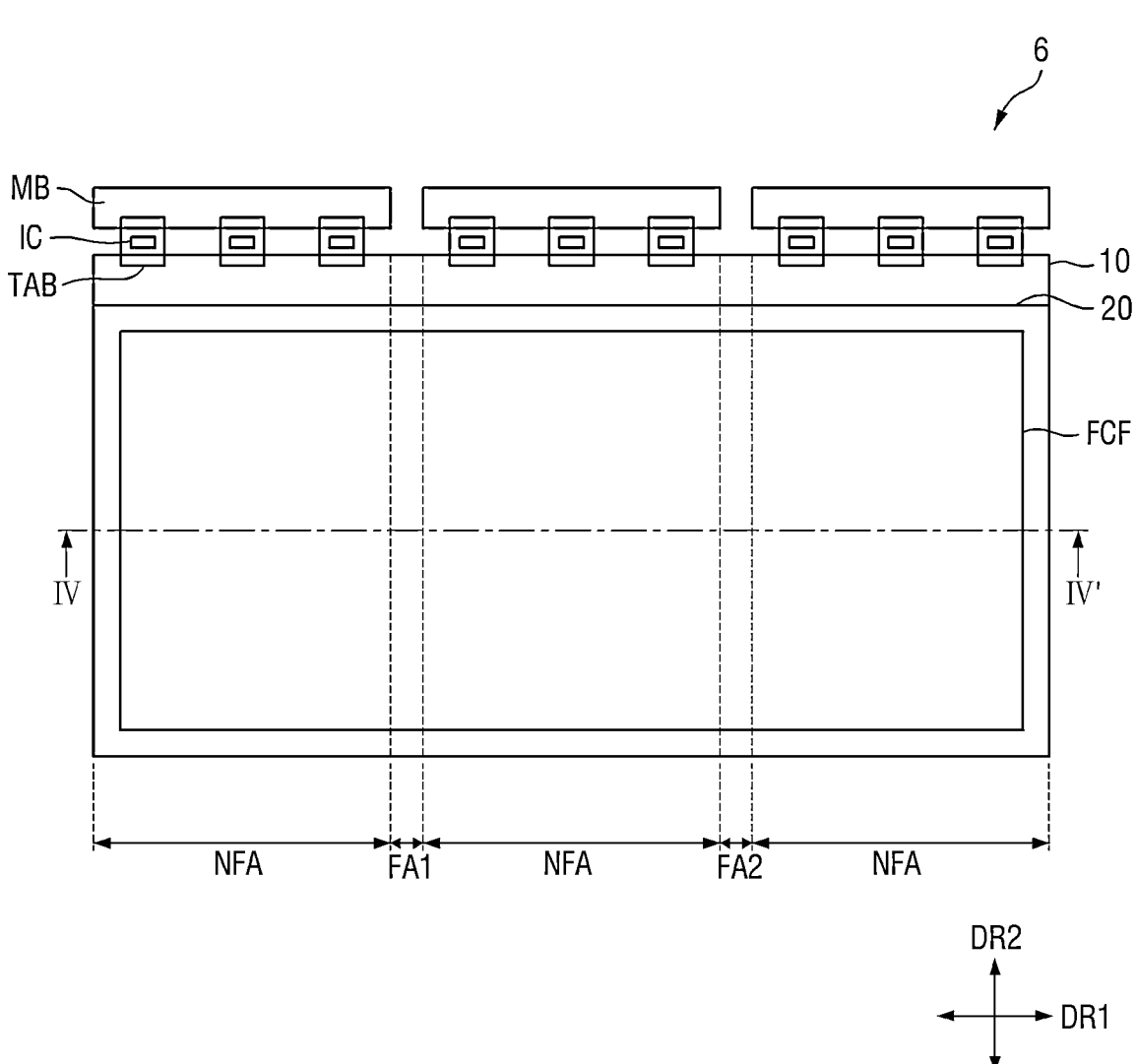
FIG. 23 is a plan view illustrating a display device according to further still another embodiment.
Figure 24:
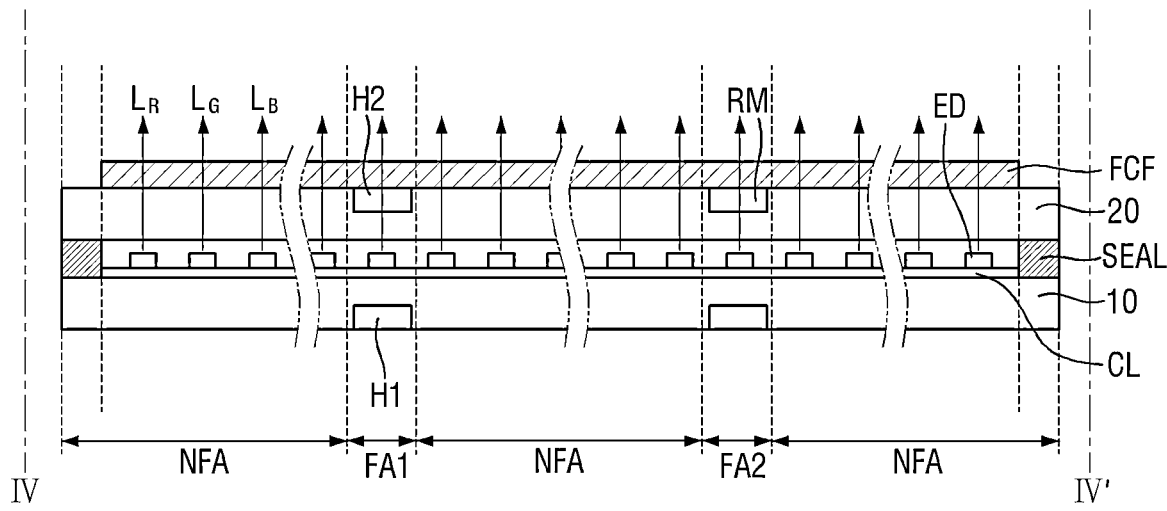
FIG. 24 is a cross-sectional view taken along line IV-IV' of FIG. 23.

FIG. 23 is a plan view illustrating a display device according to further still another embodiment. FIG. 24 is a cross-sectional view taken along line IV-IV' of FIG. 23.

Referring to FIGS. 23 and 24, a display device 6 according to the present embodiment is different from the display device 1 according to one embodiment of the present disclosure in that it is an organic light emitting display device.

In more detail, the display device 6 according to the present embodiment may be an organic light emitting display device. The display device 6 according to the present embodiment is different from the display device 1 (liquid crystal display device) according to one embodiment in that the first substrate 10 includes a display substrate, the second substrate 20 includes an encapsulation substrate, a light emitting element ED is disposed on the first substrate 10, and the liquid crystal layer 30 is omitted.

That is, in the display device 6 according to the present embodiment, the first substrate 10 may include a display substrate, and the second substrate 20 may include an encapsulation substrate. The display substrate may include a rigid material such as glass or quartz, and the encapsulation substrate may include a rigid material, such as glass or quartz, like the display substrate.

At least one conductive layer CL may be disposed on the first substrate 10. The at least one conductive layer CL may be provided as a plurality of conductive layers. The plurality of conductive layers CL may include a gate conductive layer on which a gate electrode of a thin film transistor is disposed, a source/drain conductive layer on which source/drain electrodes of the thin film transistor are disposed, and the like. Although not shown, an insulating layer may be disposed between adjacent conductive layers CL.

The conductive layer CL may further include an anode conductive layer on which a first electrode (or anode electrode) of a light emitting element ED is disposed.

The light emitting element ED may be disposed on the conductive layer CL on the first substrate 10. The light emitting element ED may be provided as a plurality of light emitting elements. The light emitting element ED may be disposed in the non-folding area NFA and the folding areas FA1 and FA2.

The light emitting element ED includes a self-light emitting element. The self-light emitting element may include an organic light emitting element. In some embodiments, the self-light emitting element may include an inorganic light emitting element such as a micro-LED and a nano-LED. The light emitting element ED may be disposed between the first substrate 10 and the second substrate 20.

The plurality of light emitting elements ED may be divided depending on a wavelength range of light emitted therefrom. For example, the plurality of light emitting elements ED may include a red light emitting element, a green light emitting element, and a blue light emitting element. The red light emitting element, the green light emitting element, and the blue light emitting element may emit red light La, green light Lb, and blue light Lc, respectively, but the present disclosure is not limited thereto. The plurality of light emitting elements ED may further include a white light emitting element that emits white light. The wavelength range is gradually reduced toward the red light La, the green light Lb and the blue light Lc.

The second substrate 20 may serve to seal the plurality of light emitting elements ED. That is, the plurality of light emitting elements ED may be sealed by the second substrate 20, the first substrate 10, and the sealing member SEAL.

The light emitting element ED according to one embodiment to which the organic light emitting element is applied may include an anode electrode (a first electrode of the organic light emitting element), an organic layer, and a cathode electrode (a second electrode of the organic light emitting element). The organic layer may include a light emitting layer. The light emitting layer may include an organic light emitting layer. The organic layer may further include hole injection/transport layers and electron injection/transport layers in addition to the organic light emitting layer. The hole injection/transport layers may be sequentially stacked between the anode electrode (the first electrode of the organic light emitting element) and the organic light emitting layer, and the electron injection/transport layers may be stacked between the organic light emitting layer and the cathode electrode (the second electrode of the organic light emitting element).

In the present embodiment, the organic light emitting layer may include a low molecular organic material. That is, the display device 6 according to the present embodiment may be an organic light emitting display device to which a low molecular organic material is applied as an organic light emitting layer.

In some embodiments, the organic light emitting layer may include a high molecular organic material. In this embodiment, the electron injection/transport layers and the hole injection layer may be omitted from the organic layer. That is, in the embodiment, the hole transport layer may be disposed between the anode electrode (the first electrode of the organic light emitting element) and the organic light emitting layer, but the present disclosure is not limited thereto. This embodiment may be applied to all of the hole injection layer and the electron injection/transport layers.

In the display device 6 according to the present embodiment, the lower polarization member POL1 of the display device 1 according to one embodiment is omitted, and the upper polarization member POL2 on one surface of the second substrate 20 is replaced with a functional film FCF. The arrangement of the functional film FCF is the same as the arrangement of the upper polarization member POL2 according to one embodiment, and thus a connection relation between the functional film FCF and its peripheral elements is substantially the same as the connection relation between the upper polarization member POL2 and its peripheral elements.

The functional film FCF may include a polarizing layer. That is, the functional film FCF may be a polarization member that includes a polarizing layer. The functional film FCF may improve external light reflection by including a polarizing layer.

The description of the substrates 10 and 20, the sealing member SEAL and the reinforcing filling pattern RM of the display device 6 according to the present embodiment are described above in the display device 1 according to one embodiment, and thus a repeated description thereof will be omitted.

Figure 25:
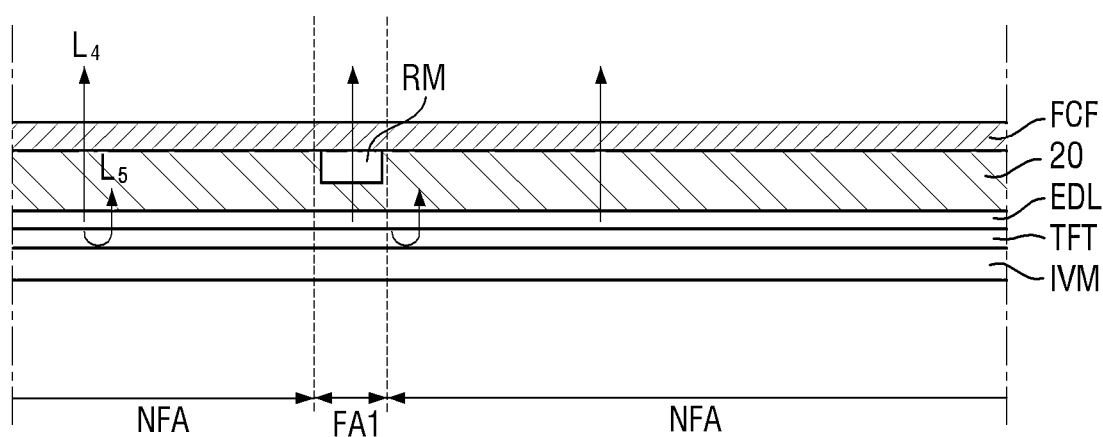
FIG. 25 is a cross-sectional view illustrating another embodiment of the display device FIGS. 23 and 24.

FIG. 25 is a cross-sectional view illustrating another embodiment of the display device FIGS. 23 and 24.

Referring to FIG. 25, the display device according to the present embodiment is different from the display device of FIG. 22 and FIG. 23 in that the display device according to the present embodiment includes an Invar support substrate IVM including an Invar alloy, a thin film transistor TFT on the Invar support substrate IVM, and a light emitting element layer EDL on the thin film transistor TFT.

The Invar support substrate IVM may include an alloy of steel and nickel. The Invar support substrate IVM serves to emit heat generated inside the display device and protect upper structures, which include the light emitting element layer EDL, in a lower portion of the light emitting element layer EDL, and may serve as a reflective member that converts a path of light emitted in a lower direction as will be described later and allows the light to be emitted to an upper direction.

The thin film transistor TFT may be disposed on the Invar support substrate IVM.

The light emitting element layer EDL having a plurality of light emitting elements electrically connected to the thin film transistor TFT may be disposed on the thin film transistor TFT. Since the light emitting element is as described above in FIGS. 23 and 24, its repeated description will be omitted.

Fourth light L4 and fifth light L5 may be emitted from the light emitting element layer EDL in the upper direction and the lower direction, respectively. The fourth light L4 may be emitted from the light emitting element layer EDL in the upper direction directed toward the second substrate 20, and the fifth light L5 may be emitted from the light emitting element layer EDL in a direction directed toward the invar support substrate IVM. The fifth light L5 may be reflected by the Invar support substrate IVM so that its path may be converted into the upper direction directed toward the second substrate 20, and then may be emitted.

FIGS. 26 to 31 are cross-sectional views illustrating a display device according to modified embodiments.

Referring to FIGS. 26 to 31, various modifications may be made in thicknesses of the first substrate 10 and the second substrate 20, and various modifications may be also made in recess depths of the recess grooves H1 and H2.

Figure 26:
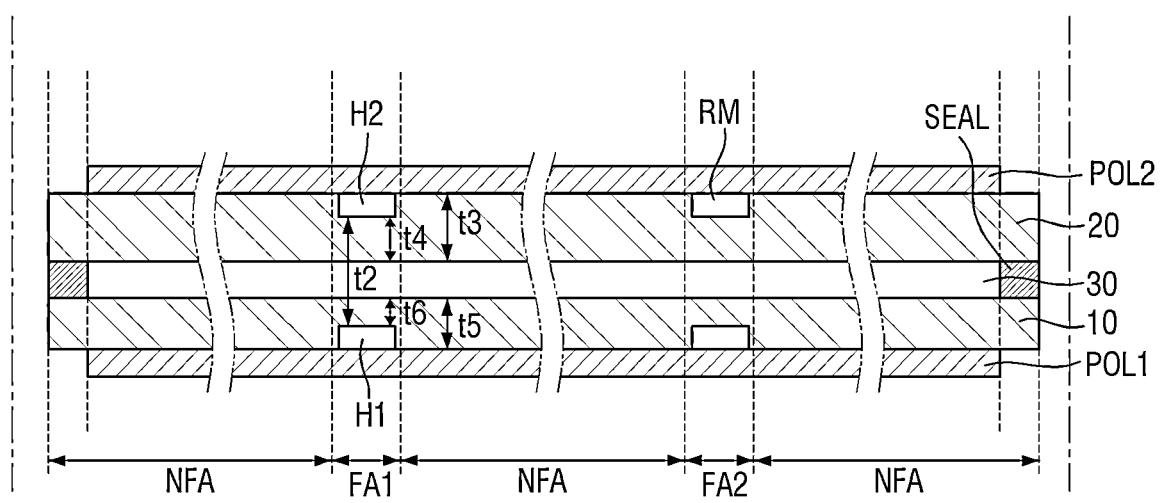
FIGS. 26 to 31 are cross-sectional views illustrating a display device according to modified embodiments.

Referring to FIG. 26, a third thickness t3 of the second substrate 20 according to the present modified embodiment may be greater than a fifth thickness t5 of the first substrate 10. The recess depths of the recess grooves H1 and H2 may be the same in each of the substrates 10 and 20. Therefore, a fourth thickness t4 of the second substrate 20 may be greater than a sixth thickness t6 of the first substrate 10.

Figure 27:
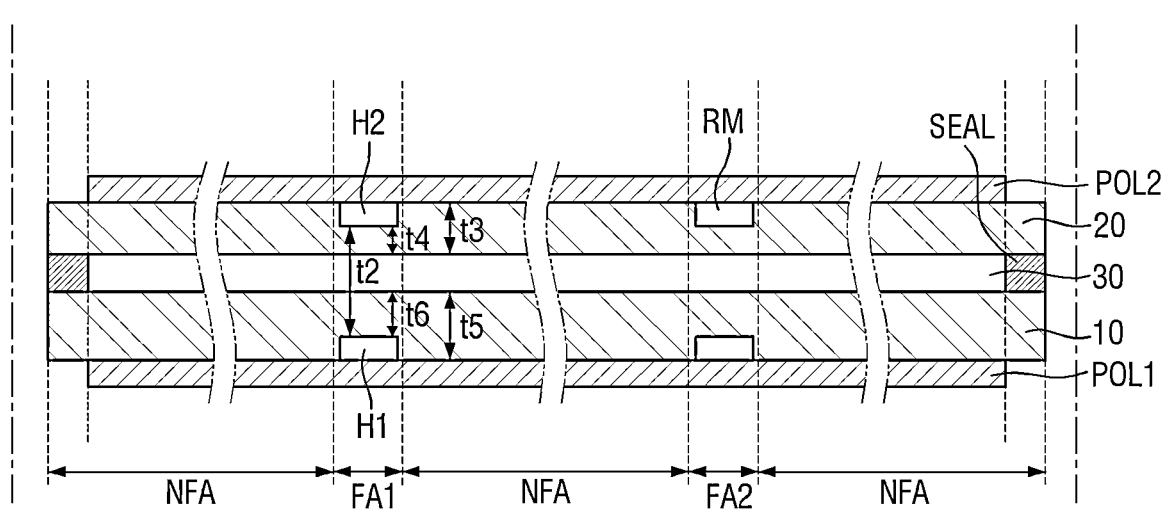

Referring to FIG. 27, the third thickness t3 of the second substrate 20 according to the present modified embodiment may be smaller than the fifth thickness t5 of the first substrate 10. The recess depths of the recess grooves H1 and H2 may be the same in each of the substrates 10 and 20. Therefore, the fourth thickness t4 of the second substrate 20 may be smaller than the sixth thickness t6 of the first substrate 10.

In the modified embodiments of FIGS. 26 and 27, the thicknesses of the substrates 10 and 20 are different from each other, and the recess grooves H1 and H2 may have the recess depths of the same level. As described above, although the thicknesses of the substrates 10 and 20 are different from each other, as the recess depths are formed at the same level, the thicknesses of the substrates 10 and 20 may be different from each other in the folding area FA.

According to the present embodiments, even though one of the substrates 10 and 20 has a greater thickness, the recess grooves H1 and H2 are formed in the folding area FA so that the substrates 10 and 20 may be well bent in a specific area.

Figure 28:
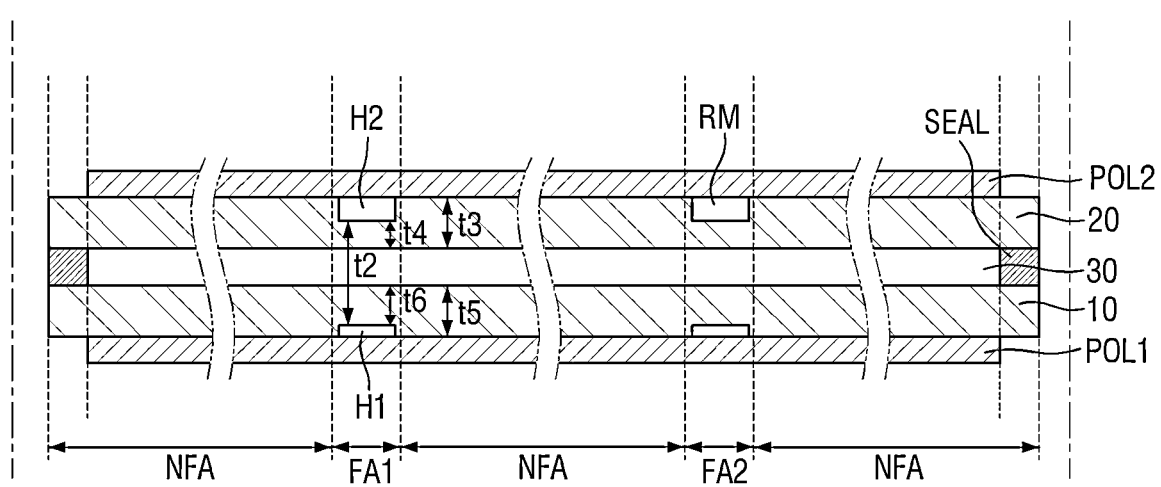

Referring to FIG. 28, the third thickness t3 of the second substrate 20 according to the present modified embodiment may be the same as the fifth thickness t5 of the first substrate 10. The fourth thickness t4 of the second substrate 20 may be smaller than the sixth thickness t6 of the first substrate 10. As a result, the recess depth of the upper recess groove H2 may be greater than the recess depth of the lower recess groove H1.

Figure 29:
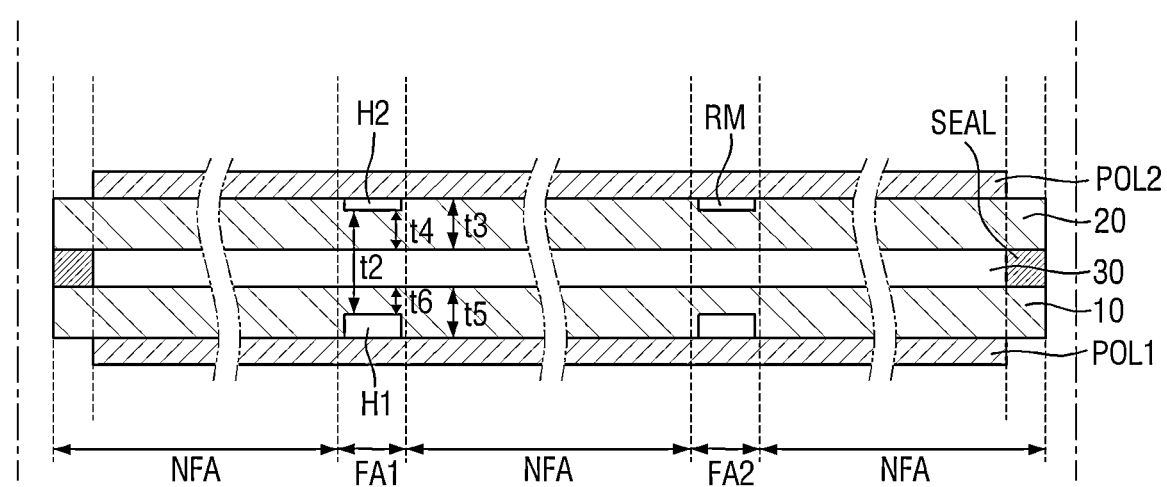

Referring to FIG. 29, the third thickness t3 of the second substrate 20 according to the present modified embodiment may be the same as the fifth thickness t5 of the first substrate 10. The fourth thickness t4 of the second substrate 20 may be greater than the sixth thickness t6 of the first substrate 10. As a result, the recess depth of the upper recess groove H2 may be smaller than the recess depth of the lower recess groove H1.

In the modified embodiments of FIGS. 28 and 29, the thicknesses of the substrates 10 and 20 are the same as each other, and the recess grooves H1 and H2 may have their respective depths different from each other. Although the original thicknesses of the substrates 10 and 20 are the same as each other as described above, the recess depths may be formed at different levels to appropriately reduce bending stress of the specific substrates 10 and 20.

For example, bending stress of the first substrate 10 may be more easily reduced when the recess depth of the lower recess groove H1 of the first substrate 10 is large. On the contrary, bending stress of the second substrate 20 may be more easily reduced when the recess depth of the upper recess groove H2 of the second substrate 20 is large.

Figure 30:
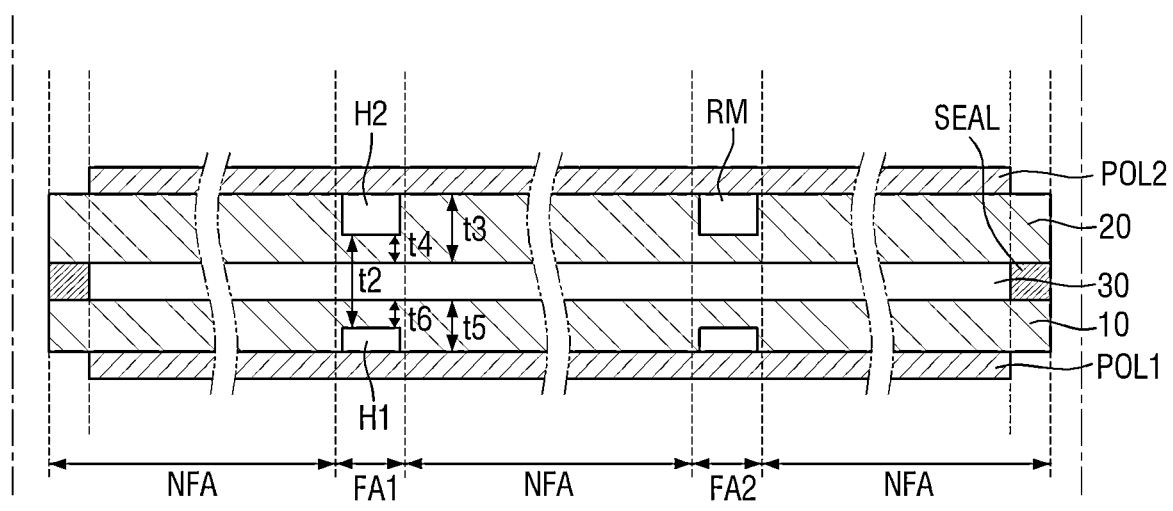

Referring to FIG. 30, the third thickness t3 of the second substrate 20 according to the present modified embodiment may be greater than the fifth thickness t5 of the first substrate 10. The recess depth of the upper recess groove H2 may be greater than that of the lower recess groove H1.

Figure 31:
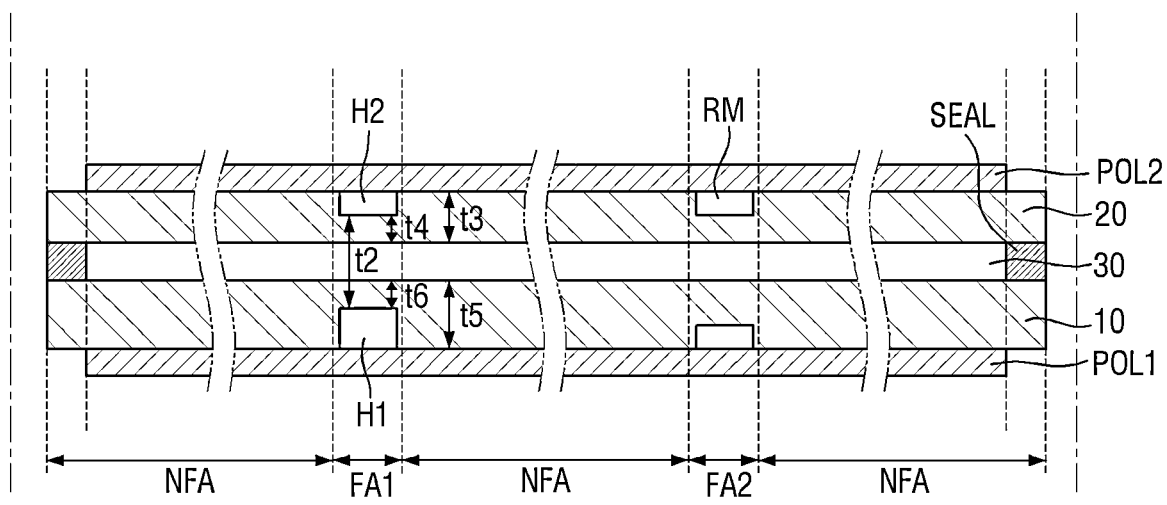

Referring to FIG. 31, the third thickness t3 of the second substrate 20 according to the present modified embodiment may be smaller than the fifth thickness t5 of the first substrate 10. The recess depth of the upper recess groove H2 may be smaller than that of the lower recess groove H1.

In the modified embodiments of FIGS. 30 and 31, the thicknesses of the substrates 10 and 20 are different from each other, and the recess grooves H1 and H2 may have their recess depths of different levels. As described above, when the original thicknesses of the substrates 10 and 20 are different from each other, a stress deviation may be generated when each of the substrates 10 and 20 is bent. In case of the present modified embodiments, the stress deviation may be reduced by adjusting the recess depths of the substrates 10 and 20, which are different from each other.

Although the embodiments of the present disclosure have been described with reference to the accompanying drawings, it will be apparent to those skilled in the art that the present disclosure may be embodied in other specific forms without departing from the spirit and essential characteristics of the specification. The above embodiments are therefore to be construed in all aspects as illustrative and not restrictive.

The invention claimed is:

1. A display device in which a first folding area, a first non-folding area on one side of the first folding area, and a second non-folding area on the other side of the first folding area are defined, the display device comprising:

a first substrate;

a second substrate disposed on the first substrate;

a liquid crystal layer disposed between the first substrate and the second substrate;

an upper polarization member disposed on one surface of the second substrate and spaced apart from the liquid crystal layer with the second substrate interposed therebetween;

a driving connection film attached to the first substrate; and a driving circuit board attached to the driving connection film, wherein the second substrate has a first thickness, which is partially slimmed, in the first folding area, the second substrate has a second thickness, which is greater than the first thickness and corresponds to an original thickness of a flat display element without being slimmed, in each of the non-folding areas, the upper polarization member is disposed over the first non-folding area, the folding area and the second non-folding area, a first gap distance between one surface of the second substrate and the upper polarization member in the first folding area is greater than a second gap distance between one surface of the second substrate and the upper polarization member in each of the non-folding areas, and the display device is configured to be folded in the first folding area, and is configured to be unfolded in each of the non-folding areas, and wherein the second substrate includes a single upper recess groove recessed toward the first substrate in the first folding area, and wherein the first substrate includes a single lower recess groove recessed toward the second substrate in the first folding area, and wherein the single upper recess groove completely overlaps the single lower recess groove in a thickness direction of the first substrate, and wherein the single upper recess groove and the single lower recess groove are not located in the non-folding areas, and wherein the driving connection film is not disposed in the first folding area, but the first non-folding area and the second non-folding area.

2. The display device of claim 1, wherein the first folding area includes a curved shape, and each of the non-folding areas includes a linear shape, and a width of the first folding area is smaller than that of each of the non-folding areas.

3. The display device of claim 1, one surface of the second substrate and the upper polarization member are spaced apart from each other with the upper recess groove interposed therebetween.

4. The display device of claim 3, further comprising a first reinforcing filling pattern disposed in the upper recess groove and disposed between one surface of the second substrate and the upper polarization member, wherein the first reinforcing filling pattern is directly in contact with one surface of the second substrate.

5. The display device of claim 4, wherein a surface of the first reinforcing filling pattern is positioned on the same plane as one surface of the second substrate in each of the non-folding areas.

6. The display device of claim 4, wherein the first reinforcement filling pattern includes an organic material, an inorganic material, or a composite material of an organic material and an inorganic material, the second substrate includes glass, a difference in a refractive index between the first reinforcing filling pattern and the second substrate is within 0.3, and the first reinforcing filling pattern has light transmittance of 70% or more with respect to a visible light wavelength range.

7. The display device of claim 4, wherein the first reinforcing filling pattern includes a light shielding material.

8. The display device of claim 4, further comprising a lower polarization member disposed on one surface of the first substrate and spaced apart from the liquid crystal layer with the first substrate interposed therebetween, wherein the first substrate has a third thickness, which is partially slimmed, in the first folding area, and in each of the non-folding areas, the first substrate has a fourth thinness that is greater than the third thickness and corresponds to an original thickness of a flat display element without being slimmed.

9. The display device of claim 8, wherein the lower polarization member is disposed over the first non-folding area, the first folding area and the second non-folding area, and a third gap distance between one surface of the first substrate and the lower polarization member in the first folding area is greater than a fourth gap distance between one surface of the first substrate and the lower polarization member in each of the non-folding areas.

10. The display device of claim 9, one surface of the first substrate and the lower polarization member are spaced apart from each other with the lower recess groove interposed therebetween, the display device further comprising a second reinforcing filling pattern disposed between one surface of the first substrate and the lower polarization member, wherein the second reinforcement filling pattern is directly in contact with one surface of the first substrate.

11. The display device of claim 10, wherein the first substrate has a thickness greater than that of the second substrate, and a recess depth of the lower recess groove is greater than that of the upper recess groove.

12. The display device of claim 10, wherein the first substrate has the same thickness as that of the second substrate, and a recess depth of the lower recess groove and a recess depth of the upper recess groove are different from each other.

13. The display device of claim 10, wherein the first substrate has a thickness greater than that of the second substrate, and a recess depth of the lower recess groove and a recess depth of the upper recess groove are the same as each other.

14. The display device of claim 10, further comprising:
a third non-folding area spaced apart from the first folding area with the second non-folding area interposed therebetween; and
a second folding area spaced apart from the first folding area with the third non-folding area interposed therebetween.

15. The display device of claim 14, wherein the second substrate further includes an upper recess groove recessed toward the first substrate in the second folding area, one surface of the second substrate and the upper polarization member are spaced apart from each other with the upper recess groove of the second substrate of the second folding area, which is interposed therebetween, and the first reinforcement filling pattern is further disposed in the upper recess groove of the second substrate of the second folding area.

16. The display device of claim 15, wherein the first substrate further includes a lower recess groove recessed toward the second substrate in the second folding area, one surface of the first substrate and the lower polarization member are spaced apart from each other with the lower recess groove of the first substrate of the second folding area, which is interposed therebetween, and the second reinforcement filling pattern is further disposed in the lower recess groove of the first substrate of the second folding area.

* * * * *